United States Patent
Nishimura

(10) Patent No.: US 10,243,052 B2
(45) Date of Patent: Mar. 26, 2019

(54) SEMICONDUCTOR MEMORY DEVICE AND METHOD FOR MANUFACTURING THE SAME

(71) Applicant: Toshiba Memory Corporation, Minato-ku (JP)

(72) Inventor: Jun Nishimura, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 71 days.

(21) Appl. No.: 15/463,137

(22) Filed: Mar. 20, 2017

(65) Prior Publication Data
US 2018/0076293 A1   Mar. 15, 2018

Related U.S. Application Data

(60) Provisional application No. 62/394,459, filed on Sep. 14, 2016.

(51) Int. Cl.
H01L 29/40     (2006.01)
H01L 27/11582  (2017.01)
H01L 27/11565  (2017.01)

(52) U.S. Cl.
CPC ...... *H01L 29/408* (2013.01); *H01L 27/11565* (2013.01); *H01L 27/11582* (2013.01)

(58) Field of Classification Search
CPC .............. H01L 27/115–27/11597; H01L 23/522–23/53295; H01L 21/768–21/76898
See application file for complete search history.

(56) References Cited

U.S. PATENT DOCUMENTS

| | | | |
|---|---|---|---|
| 8,502,300 B2 | 8/2013 | Fukuda et al. | |
| 9,349,876 B2 | 5/2016 | Hirano et al. | |
| 2014/0054676 A1* | 2/2014 | Nam | H01L 29/7926 257/324 |
| 2015/0079742 A1 | 3/2015 | Pachamuthu et al. | |
| 2016/0126252 A1 | 5/2016 | Tsuda et al. | |

FOREIGN PATENT DOCUMENTS

| | | |
|---|---|---|
| JP | 2010-212604 | 9/2010 |
| JP | 2012-69679 | 4/2012 |
| JP | 2014-120735 | 6/2014 |
| JP | 2016-92044 | 5/2016 |

* cited by examiner

*Primary Examiner* — Sonya D. McCall-Shepard
(74) *Attorney, Agent, or Firm* — Oblon, McClelland, Maier & Neustadt, L.L.P.

(57) ABSTRACT

According to one embodiment, a semiconductor memory device includes a substrate, a stacked body, a semiconductor portion, and an insulating portion. The insulating portion is provided in the stacked body and extends in a stacking direction and a first direction along a surface of the substrate, the first direction crossing the stacking direction. The insulating portion includes a first insulating film containing silicon oxide, a second insulating film containing silicon oxide, and a third insulating film located between the first insulating film and the second insulating film and containing silicon nitride.

5 Claims, 26 Drawing Sheets

FIG. 12A
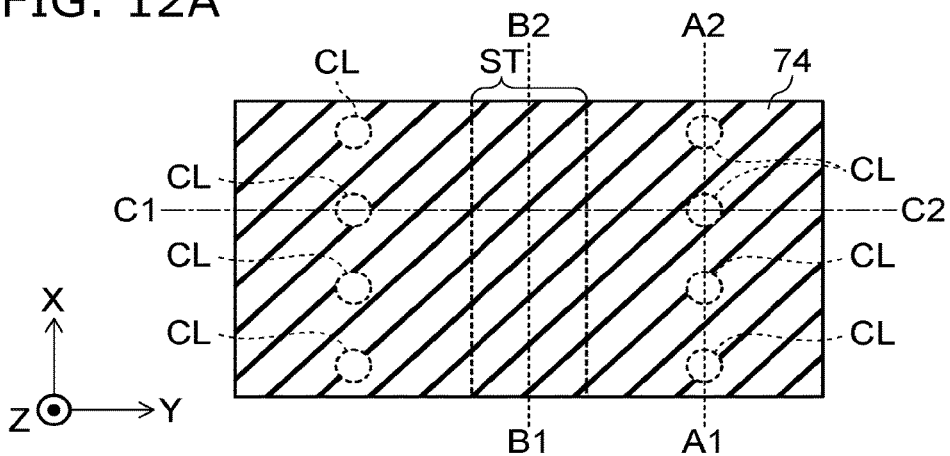
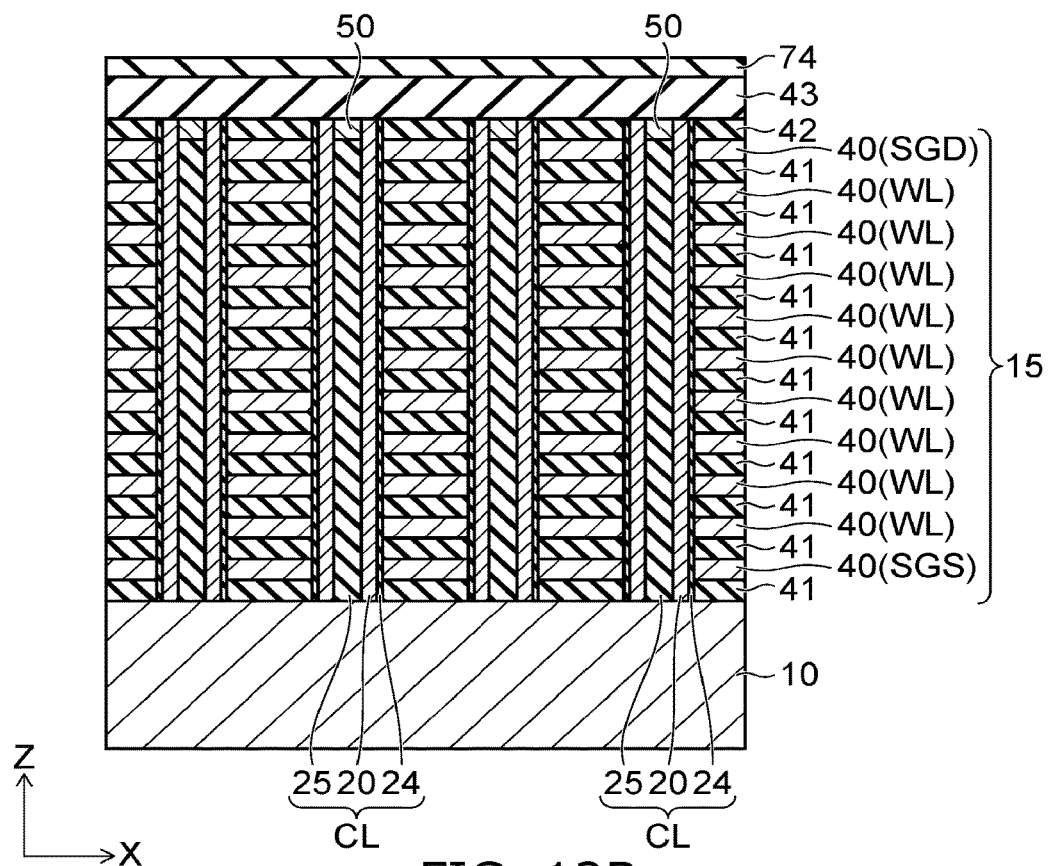
FIG. 12B

US 10,243,052 B2

SEMICONDUCTOR MEMORY DEVICE AND METHOD FOR MANUFACTURING THE SAME

CROSS-REFERENCE TO RELATED APPLICATIONS

This application is based upon and claims the benefit of priority from U.S. Provisional Patent Application 62/394,459 filed on Sep. 14, 2016; the entire contents of which are incorporated herein by reference.

FIELD

Embodiments described herein relate generally to a semiconductor memory device and a method for manufacturing the same.

BACKGROUND

Recently, a stacked-type semiconductor memory device in which memory cells are three-dimensionally integrated has been proposed. In such a semiconductor memory device, a stacked body in which a plurality of electrode layers is stacked is provided, and a channel piercing the stacked body is provided. Further, a memory cell including a charge storage film is formed at each crossing portion between the electrode layer and the channel. For such a semiconductor memory device, an object is to improve an electrical characteristic of the memory cell.

BRIEF DESCRIPTION OF THE DRAWINGS

FIG. 5 to FIG. 7, FIG. 8A and FIG. 8B to FIG. 17A and FIG. 17B are views showing a manufacturing method of the semiconductor memory device according to the first embodiment;
FIG. 20A and FIG. 20B to FIG. 23A and FIG. 23B are views showing a manufacturing method of the semiconductor memory device according to the second embodiment.

DETAILED DESCRIPTION

Figure 1:
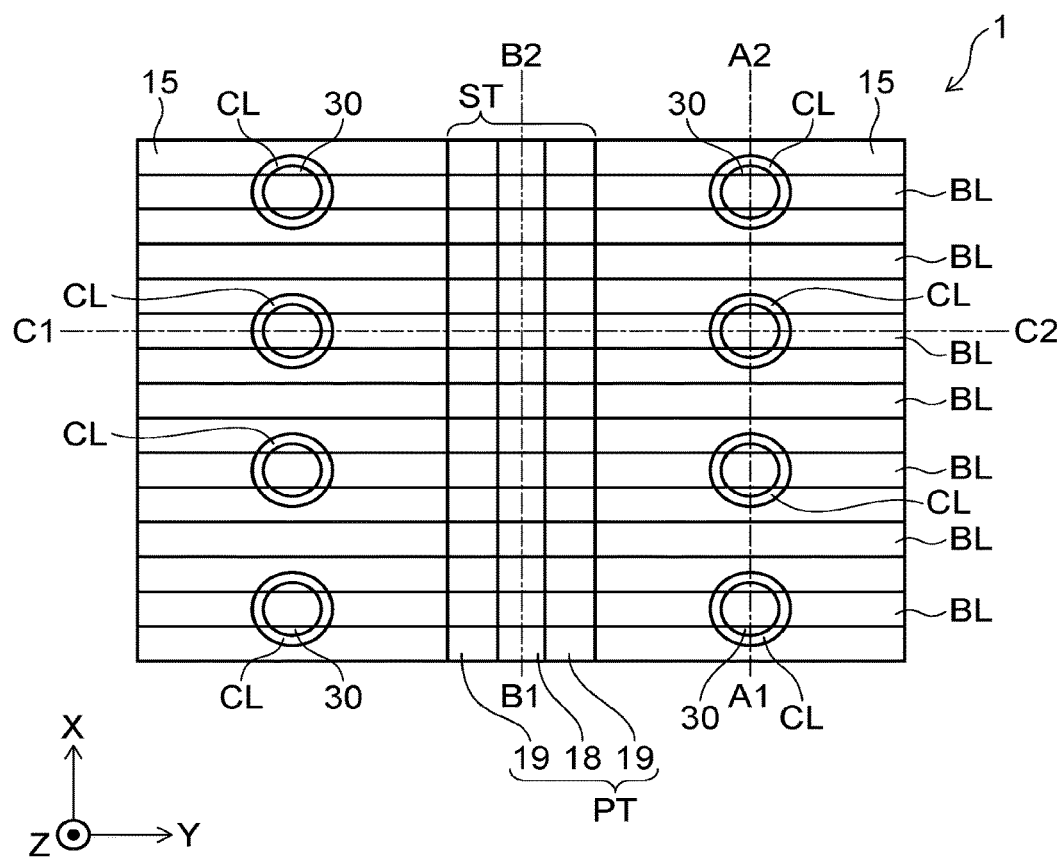
FIG. 1 is a plan view showing a semiconductor memory device according to a first embodiment.

According to one embodiment, a semiconductor memory device includes a substrate, a stacked body, a semiconductor portion, and an insulating portion. The stacked body is provided on the substrate and includes a plurality of electrode layers separately stacked each other. The semiconductor portion is provided in the stacked body and extends in a stacking direction of the plurality of electrode layers. The insulating portion is provided in the stacked body and extends in the stacking direction and a first direction along a surface of the substrate, the first direction crossing the stacking direction. The insulating portion includes a first insulating film containing silicon oxide, a second insulating film containing silicon oxide, and a third insulating film located between the first insulating film and the second insulating film and containing silicon nitride.

Hereinafter, embodiments will be described with reference to the drawings. Incidentally, in the respective drawings, the same elements are denoted by the same reference numerals.

First Embodiment

Figure 2A:
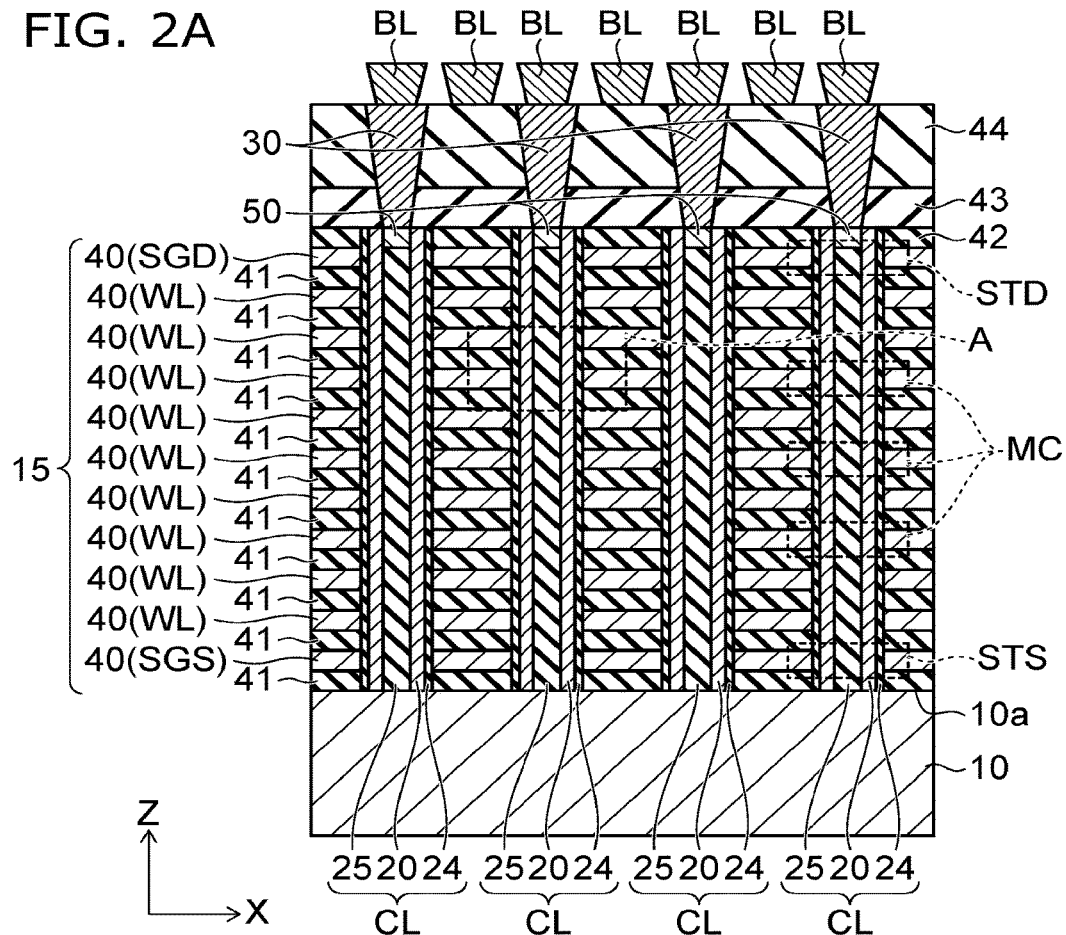
FIG. 2A is a cross-sectional view along line A1-A2 of FIG. 1.
Figure 2B:
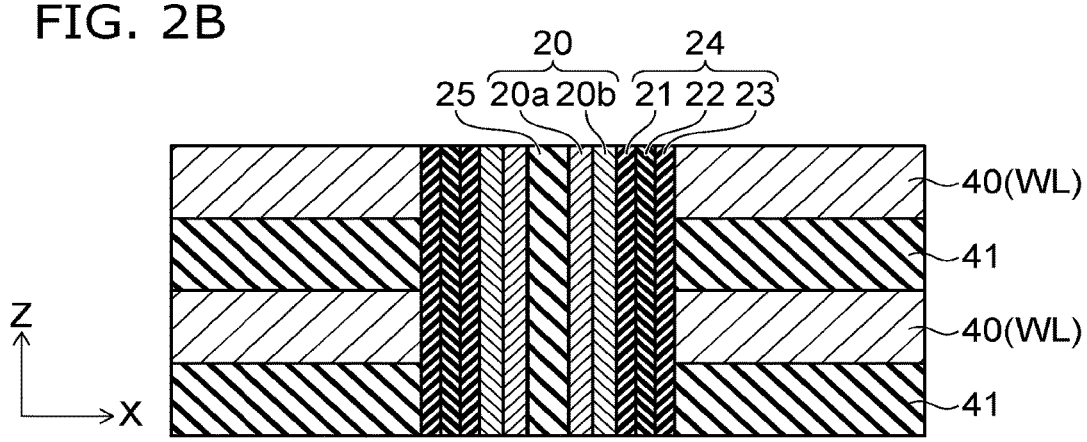
FIG. 2B is an enlarged view of region A of FIG. 2A.
Figure 3:
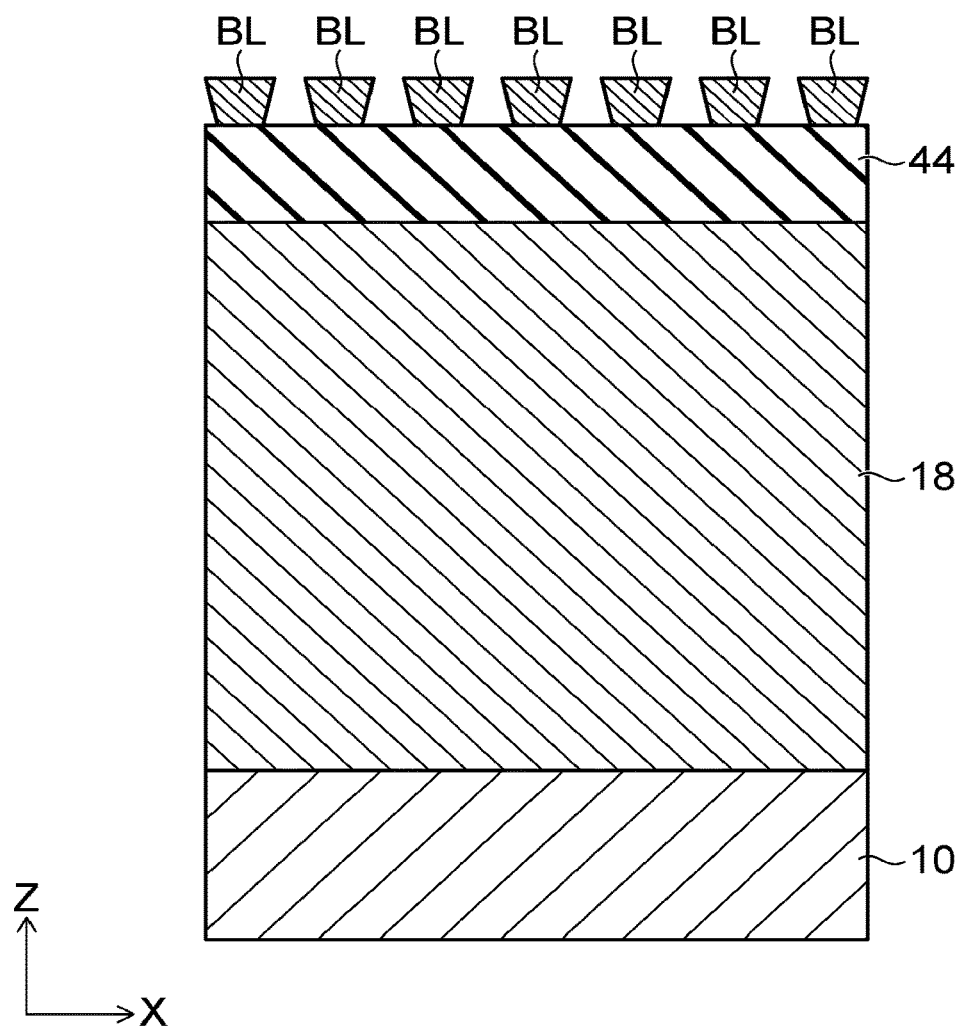
FIG. 3 is a cross-sectional view along line B1-B2 of FIG. 1.
Figure 4:
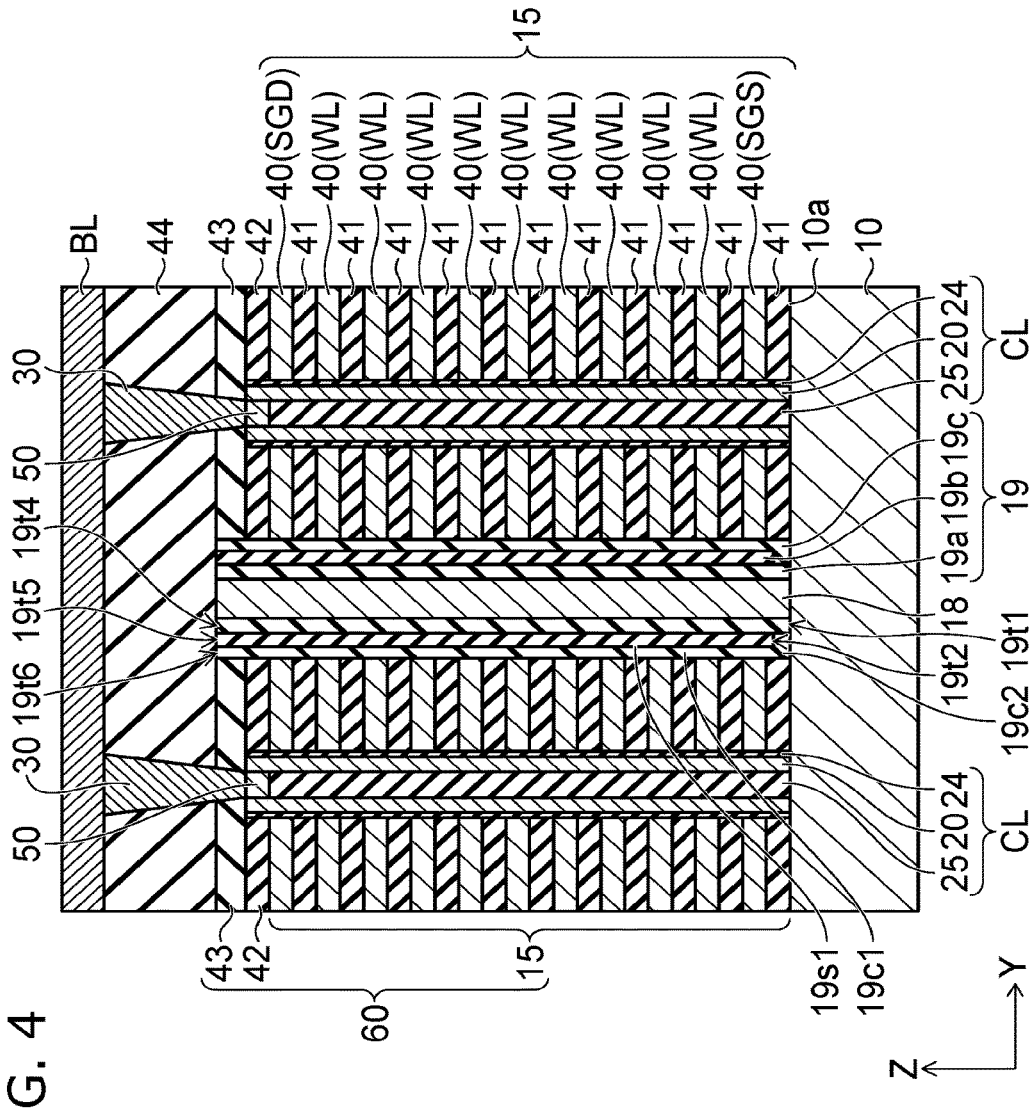
FIG. 4 is a cross-sectional view along line C1-C2 of FIG. 1.

FIG. 1 shows a plane of a memory cell array of a semiconductor memory device 1 in an enlarged manner.
FIG. 2A shows an X-Z cross section taken along a line A1-A2 of FIG. 1, and FIG. 2B shows a region A of FIG. 2A in an enlarged manner.
FIG. 3 shows an X-Z cross section taken along a line B1-B2 of FIG. 1.
FIG. 4 shows a Y-Z cross section taken along a line C1-C2 of FIG. 1.

As shown in FIG. 1, the semiconductor memory device 1 includes a stacked body 15, a plurality of columnar portions CL, and a plate-shaped portion PT. In the semiconductor memory device 1, a slit ST is formed.

As shown in FIG. 2A, the stacked body 15 is provided on a substrate 10. The substrate 10 is a semiconductor substrate, and contains, for example, silicon (Si).

Incidentally, in the specification, two directions parallel to an upper surface 10a of the substrate 10 and also orthogonal to each other are referred to as X-direction and Y-direction, and a direction orthogonal to both X-direction and Y-direction is referred to as Z-direction.

The stacked body 15 includes a source-side selection gate SGS, a drain-side selection gate SGD, a plurality of word lines WL, and a plurality of insulating layers 41. The source-side selection gate SGS is provided on the substrate 10 through the insulating layer 41. The drain-side selection gate SGD is provided on the uppermost layer of the stacked body 15. The plurality of word lines WL is provided between the source-side selection gate SGS and the drain-side selection gate SGD. The source-side selection gate SGS, the plurality of word lines WL, and the drain-side selection gate SGD are electrode layers 40. The electrode layers 40 contain, for example, a metal such as tungsten (W). The number of stacked electrode layers 40 is arbitrary.

The insulating layer 41 is provided between the electrode layers 40. The insulating layer 41 contains, for example, silicon oxide (SiO). On the stacked body 15, an insulating layer 42 and an insulating layer 43 are provided in this order. The insulating layer 42 and the insulating layer 43 contain, for example, silicon oxide.

A plurality of columnar portions CL is provided in the stacked body 15. The columnar portions CL extend in the Z-direction in the stacked body 15. The columnar portions CL are formed, for example, in a circular columnar shape or an elliptical columnar shape. The plurality of columnar portions CL is disposed in a predetermined shape in an X-Y plane.

The columnar portion CL includes a core portion 25, a channel 20 (semiconductor portion), and a memory film 24. The core portion 25 contains, for example, silicon oxide. A shape of the core portion 25 is, for example, a circular columnar shape. The channel 20 is provided around the core portion 25. A shape of the channel 20 is, for example, a cylindrical shape.

A lower end of each of the core portion 25 and the channel 20 is in contact with the substrate 10. On an upper end of the core portion 25, a contact plug 50 formed of silicon or the like is provided. An upper end of the contact plug 50 is connected to a contact portion 30.

The memory film 24 is provided around the channel 20. A shape of the memory film 24 is, for example, a cylindrical shape.

As shown in FIG. 2B, the channel 20 includes a body 20a and a cover layer 20b. The cover layer 20b is provided around the body 20a. The body 20a and the cover layer 20b contain silicon, for example, polysilicon obtained by crystallization of amorphous silicon.

The memory film 24 includes a tunnel insulating film 21, a charge storage film 22, and a block insulating film 23. The tunnel insulating film 21 is provided around the channel 20. The tunnel insulating film 21 contains, for example, silicon oxide.

The charge storage film 22 is provided around the tunnel insulating film 21. The charge storage film 22 contains, for example, silicon nitride (SiN). As shown in FIG. 2A, a memory cell MC including the charge storage film 22 is formed at each crossing portion between the channel 20 and the word line WL.

The tunnel insulating film 21 is a potential barrier between the charge storage film 22 and the channel 20. In the tunnel insulating film 21, when a charge moves from the channel 20 to the charge storage film 22 (writing operation), and when a charge moves from the charge storage film 22 to the channel 20 (erasing operation), these charges tunnel.

The charge storage film 22 has a trap site which traps a charge in the film. A threshold of the memory cell MC changes depending on the presence or absence of a charge trapped by the trap site, and the amount of a trapped charge. Thereby, the memory cell MC holds information.

The block insulating film 23 is provided around the charge storage film 22. For example, the block insulating film 23 is a silicon oxide film containing silicon oxide or an aluminum oxide film containing aluminum oxide (A10). The block insulating film 23 may be a stacked film of a silicon oxide film and an aluminum oxide film. The block insulating film 23 protects, for example, the charge storage film 22 from etching when forming the electrode layer 40.

As shown in FIG. 1 and FIG. 2A, on an upper side of the columnar portions CL, a plurality of bit lines BL extending in the Y-direction is provided. An upper end of the columnar portion CL is connected to one bit line BL through the contact plug 50 and the contact portion 30. The contact portion 30 is formed of a conductor such as a metal.

The slit ST is formed in the stacked body 15. The slit ST extends in the Z-direction and X-direction in the stacked body 15. The slit ST separates the stacked body 15 into a plurality of regions in the Y-direction. Each region separated by the slit ST is called "block". The columnar portion CL selected one by one from each block is electrically connected to one bit line BL.

As shown in FIG. 1, FIG. 3, and FIG. 4, the plate-shaped portion PT is provided in the slit ST. The plate-shaped portion PT extends in the Z-direction and X-direction. The plate-shaped portion PT includes an interconnect portion 18 and an insulating portion 19. In an example shown in FIG. 1, in the plate-shaped portion PT, the interconnect portion 18 is provided between the insulating portions 19.

The interconnect portion 18 contains, for example, a metal such as tungsten (W). The interconnect portion 18 may be configured such that a lower portion contains polysilicon, and an upper portion contains tungsten. The interconnect portion 18 extends in the Z-direction and X-direction, and has a shape of, for example, a plate shape. A lower end of the interconnect portion 18 is in contact with the substrate 10. An upper end of the interconnect portion 18 is connected to an upper layer interconnect (not shown) extending in the Y-direction through a contact. For example, a source line is formed of the interconnect portion 18 and the upper layer interconnect.

The insulating portion 19 is provided on a side surface of the interconnect portion 18. The insulating portion 19 is located between the interconnect portion 18 and a structure body 60 composed of the stacked body 15, the insulating layer 42, and the insulating layer 43. The insulating portion 19 extends in the Z-direction and X-direction, and has a shape of, for example, a plate shape. The insulating portion 19 electrically insulates the interconnect portion 18 from the electrode layers 40 of the stacked body 15.

The insulating portion 19 includes an insulating film 19a, an insulating film 19b, and an insulating film 19c. The insulating film 19a, the insulating film 19b, and the insulating film 19c are located in this order from the interconnect portion 18 to the structure body 60. Since the insulating portion 19 extends in the Z-direction and X-direction, each of the insulating film 19a, the insulating film 19b, and the insulating film 19c extends in the Z-direction and X-direction.

The insulating film 19a is provided on a side surface of the interconnect portion 18, and contains, for example, silicon oxide. A shape of the insulating film 19a is, for example, a plate shape. A lower end 19t1 of the insulating film 19a is located on the substrate 10, and for example, is in contact with the substrate 10.

The insulating film 19b is provided on a side surface of the insulating film 19a, and contains, for example, silicon nitride. A shape of the insulating film 19b is, for example, a plate shape.

The insulating film 19c includes a side portion 19c1 and a bottom portion 19c2. The side portion 19c1 of the insulating film 19c is provided on a side surface 19s1 of the insulating film 19b. On the bottom portion 19c2 of the insulating film 19c, a lower end 19t2 of the insulating film 19b is located. For example, the bottom portion 19c2 and the lower end 19t2 are in contact with each other. The insulating film 19c contains, for example, silicon oxide. A shape of the insulating film 19c is, for example, an L shape.

On the interconnect portion 18, the insulating portion 19, and the insulating layer 43, an insulating layer 44 is provided. The insulating layer 44 contains, for example, silicon oxide. The insulating layer 44 is located on an upper end 19t4 of the insulating film 19a, an upper end 19t5 of the insulating film 19b, and an upper end 19t6 of the insulating film 19c, and for example, is in contact with the upper ends 19t4, 19t5, and 19t6. In the insulating layer 44 and the insulating layer 43, the contact portion 30 is located.

As shown in FIG. 2A, at a crossing portion between the source-side selection gate SGS and the columnar portion CL, a source-side selection transistor STS is formed, and at a crossing portion between the drain-side selection gate SGD and the columnar portion CL, a drain-side selection transistor STD is formed. Further, at a crossing portion between the word line WL and the columnar portion CL, a memory cell MC is formed.

In the source-side selection transistor STS, the source-side selection gate SGS functions as a gate, and in the drain-side selection transistor STD, the drain-side selection gate SGD functions as a gate. In the memory cell MC, the word line WL functions as a gate, and a part of the columnar portion CL functions as a channel. A plurality of memory cells MC is connected in series between the source-side selection transistor STS and the drain-side selection transistor STD through the columnar portion CL.

Hereinafter, a method for manufacturing the semiconductor memory device according to the first embodiment will be described.

FIG. 5 to FIG. 7, FIG. 8A and FIG. 8B to FIG. 17A and FIG. 17B are sectional views showing the method for manufacturing the semiconductor memory device according to the first embodiment.

Figure 5:
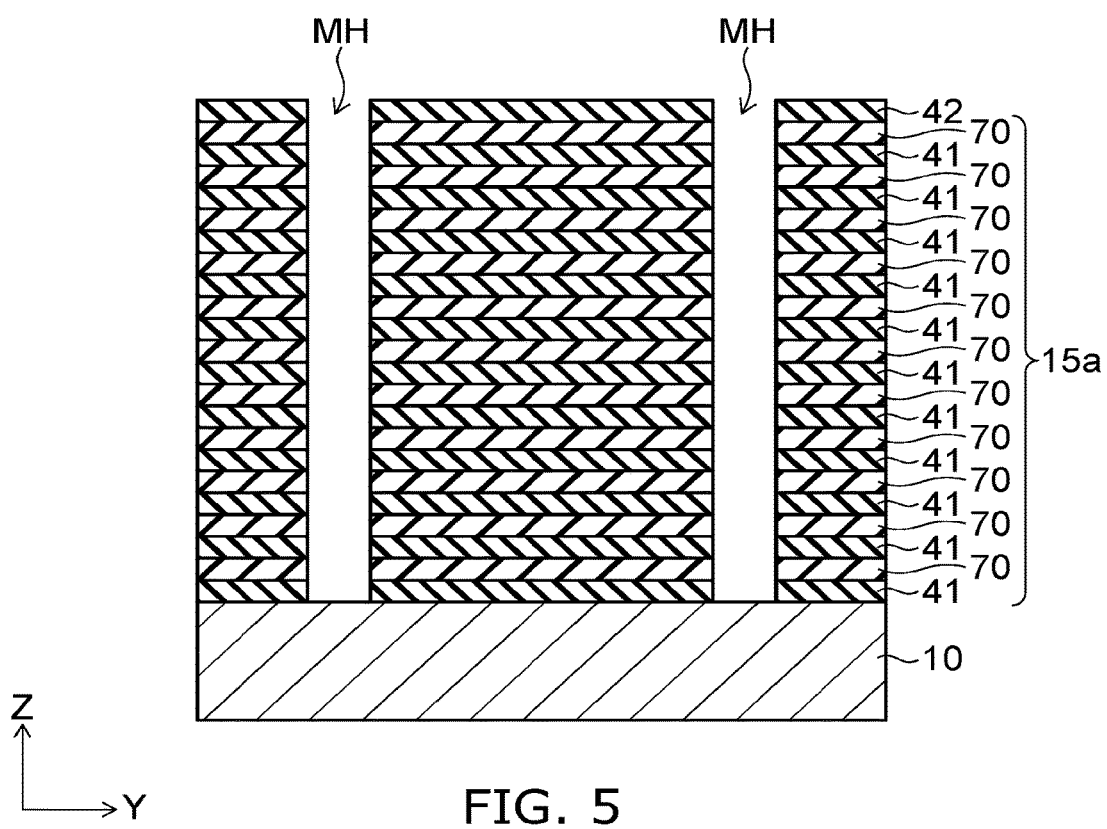
Figure 6:
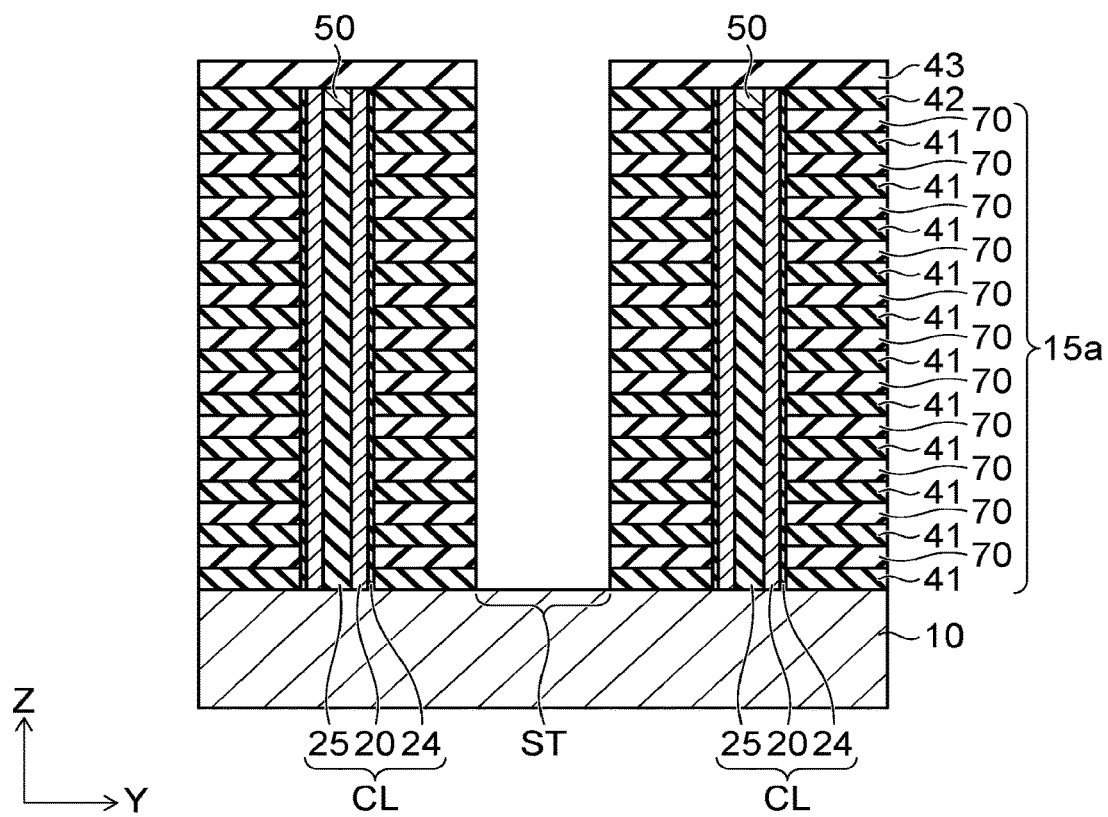
Figure 7:
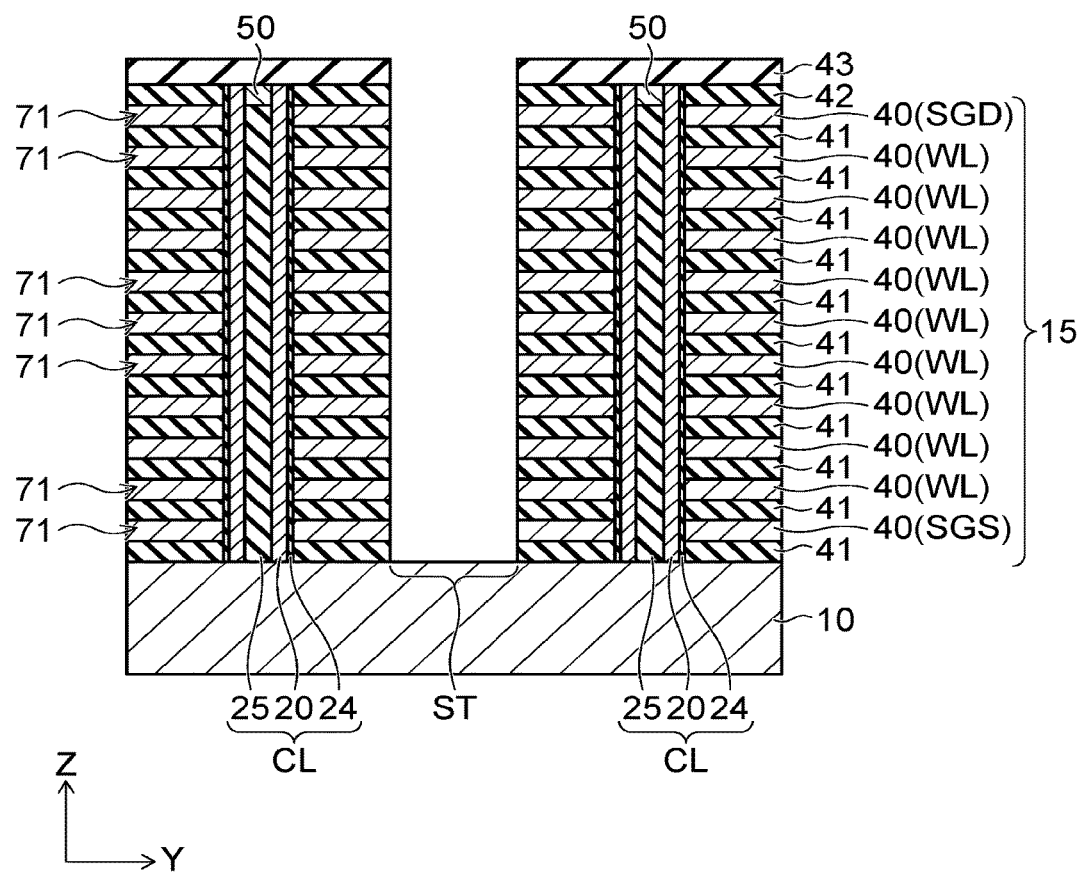
Figure 8A:
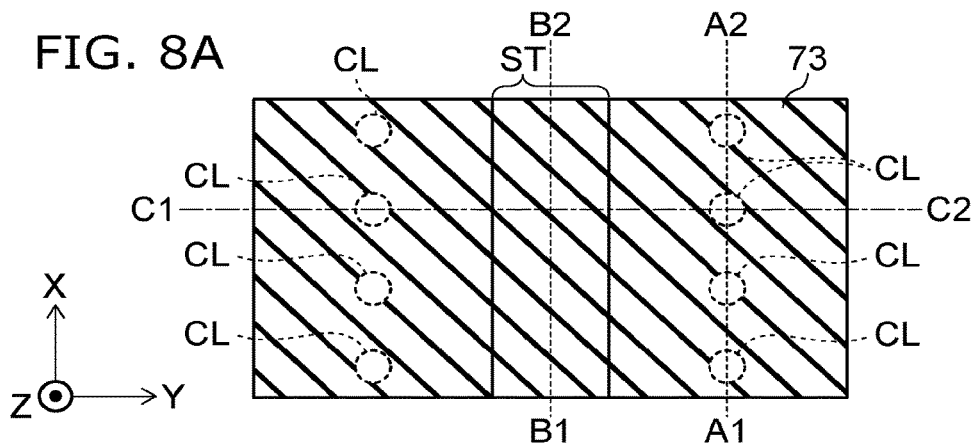
Figure 8B:
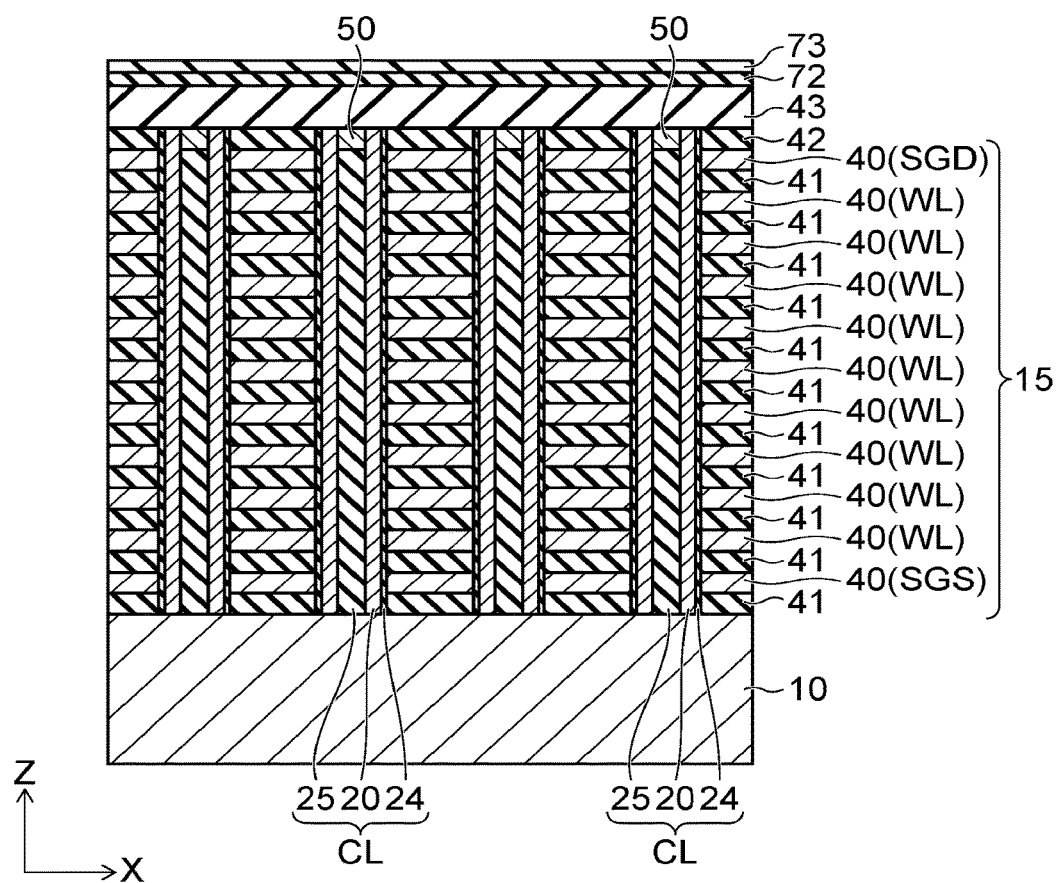

First, with reference to FIG. 5 to FIG. 7, a flow of the method for manufacturing the semiconductor memory device 1 will be briefly described. FIG. 5 to FIG. 7 are each a cross section corresponding to FIG. 4 and shows a portion on a lower side of the insulating layer 44.

First, as shown in FIG. 5, an insulating layer 41 and a sacrifice layer 70 are alternately stacked along the Z-direction on a substrate 10 by, for example, a CVD (Chemical Vapor Deposition) method, whereby a stacked body 15a is formed. The sacrifice later 70 is formed of a material having an etching selection ratio with respect to the insulating layer 41, and is formed of, for example, silicon nitride. Subsequently, an insulating layer 42 is formed by depositing silicon oxide on the stacked body 15a, and thereafter, a memory hole MH (through-hole) is formed in the stacked body 15a by, for example, a lithography method and an RIE (Reactive Ion Etching) method. The memory hole MH pierces the stacked body 15a and the insulating layer 42 and reaches the substrate 10.

Subsequently, as shown in FIG. 6, a block insulating film 23 is formed by depositing silicon oxide on an inner surface of the memory hole MH, a charge storage film 22 is formed by depositing silicon nitride, and a tunnel insulating film 21 is formed by depositing silicon oxide using, for example, a CVD method. Thereafter, by performing RIE, the block insulating film 23, the charge storage film 22, and the tunnel insulating film 21 are removed from a bottom surface of the memory hole MH, whereby the substrate 10 is exposed. By doing this, a memory film 24 including the tunnel insulating film 21, the charge storage film 22, and the block insulating film 23 is formed.

Subsequently, a cover layer 20b and a body 20a are formed by depositing polysilicon, and a core portion 25 is formed by depositing silicon oxide. By doing this, a channel 20 including the cover layer 20b and the body 20a is formed. The channel 20 is in contact with the substrate 10. Further, a columnar portion CL including the core portion 25, the channel 20, and the memory film 24 is formed. Thereafter, an upper part of the core portion 25 is removed by etching back, and silicon is embedded therein, whereby a contact plug 50 is formed.

Subsequently, an insulating layer 43 is formed by depositing silicon oxide on the insulating layer 42, and thereafter, a slit ST extending in the X-direction and Z-direction is formed in the stacked body 15a, the insulating layer 42, and the insulating layer 43 by, for example, anisotropic etching such as RIE. By the slit ST, the stacked body 15a is divided into a plurality of regions.

Subsequently, as shown in FIG. 7, the sacrifice layer 70 is removed by wet etching through the slit ST. For example, in a case where the sacrifice layer 70 is formed of silicon nitride, phosphoric acid is used as an etchant for wet etching, and a treatment is performed by hot phosphoric acid. By removing the sacrifice layer 70 through the slit ST, a cavity 71 is formed.

Subsequently, an electrode layer 40 is formed by depositing tungsten in the cavity 71 by, for example, a CVD method. By doing this, a stacked body 15 including a source-side selection gate SGS, a drain-side selection gate SGD, a plurality of word lines WL, and a plurality of insulating layers 41 is formed.

This is a simple flow of the method for manufacturing the semiconductor memory device 1, however, in the embodiment, after the above-mentioned process in FIG. 7, the formation of a plate-shaped portion PT is performed as follows. This will be described with reference to FIG. 8A and FIG. 8B to FIG. 17A and FIG. 17B.

FIG. 8A, FIG. 10A, FIG. 12A, FIG. 14A, and FIG. 16A are each a plane corresponding to FIG. 1, and each show a process for forming a region shown in FIG. 1 after the process in FIG. 7. FIG. 8B, FIG. 10B, FIG. 12B, FIG. 14B, and FIG. 16B are each a cross section corresponding to FIG. 2A, and each show an X-Z cross section taken along a line A1-A2 of FIG. 8A, FIG. 10A, FIG. 12A, FIG. 14A, and FIG. 16A, respectively.

FIG. 9A, FIG. 11A, FIG. 13A, FIG. 15A, and FIG. 17A are each a cross section corresponding to FIG. 3, and each show an X-Z cross section taken along a line B1-B2 of FIG. 8A, FIG. 10A, FIG. 12A, FIG. 14A, and FIG. 16A, respectively. FIG. 9B, FIG. 11B, FIG. 13B, FIG. 15B, and FIG. 17B are each a cross section corresponding to FIG. 4, and each show a Y-Z cross section taken along a line C1-C2 of FIG. 8A, FIG. 10A, FIG. 12A, FIG. 14A, and FIG. 16A, respectively.

After the process in FIG. 7, as shown in FIG. 8A, FIG. 8B, FIG. 9A, and FIG. 9B, an insulating film 72 is formed by depositing silicon oxide on an inner surface of the slit ST and on the insulating layer 43 by, for example, a PEALD (Plasma Enhanced Atomic Layer Deposition) method.

Figure 9A:
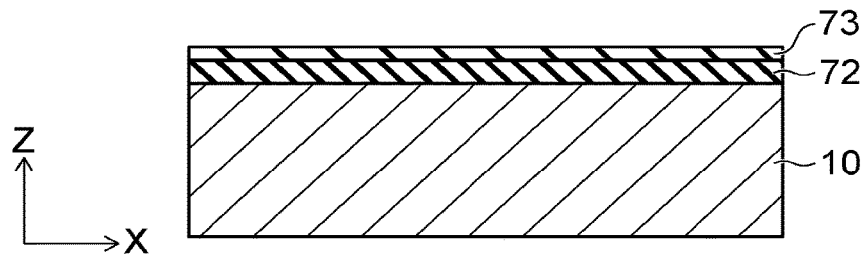
Figure 9B:
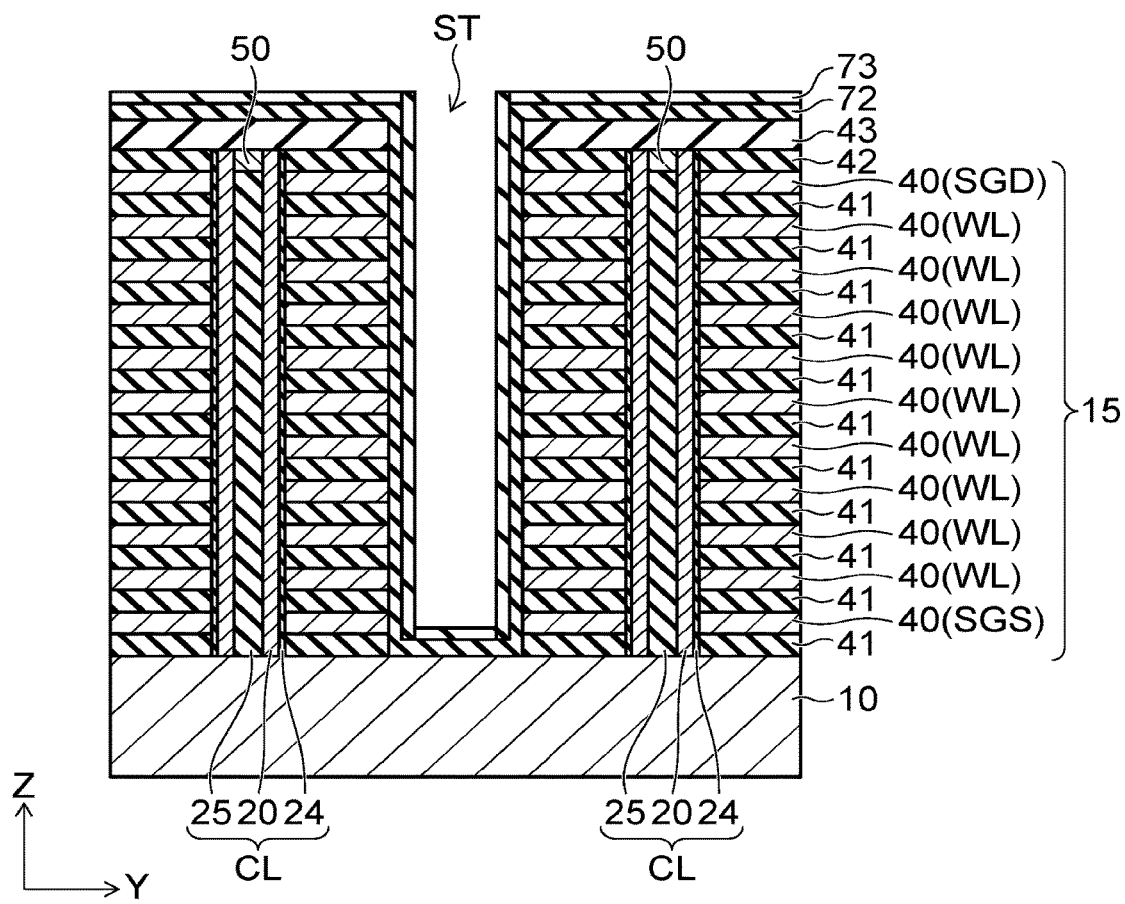
Figure 10A:
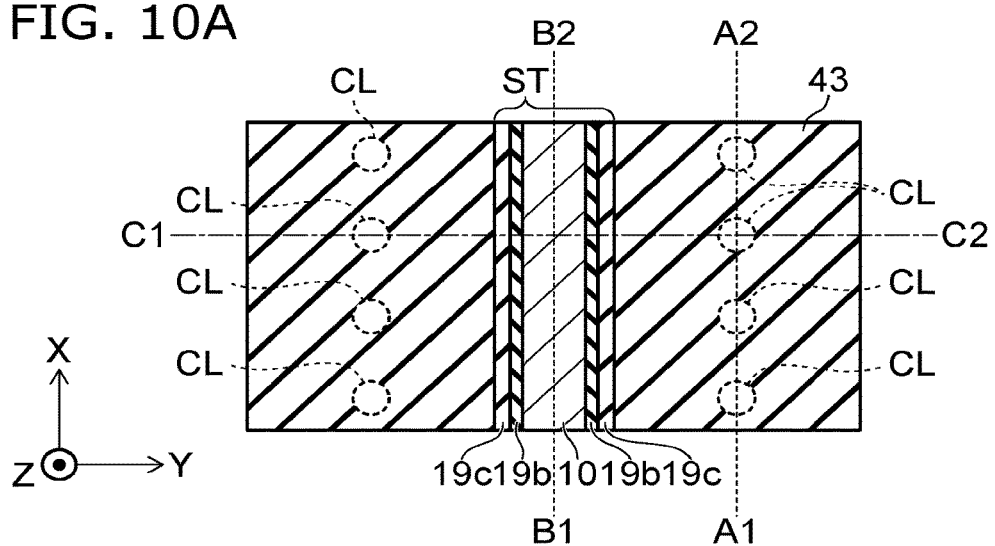
Figure 10B:
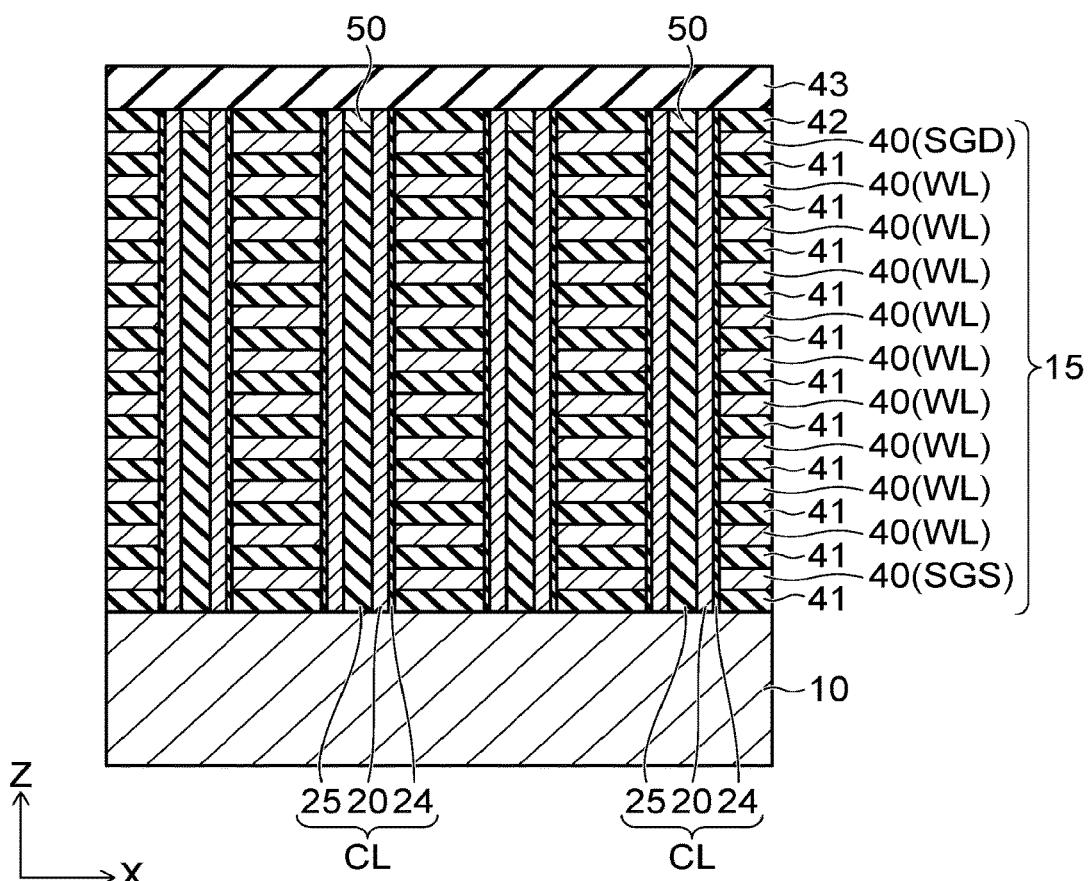
Figure 11A:
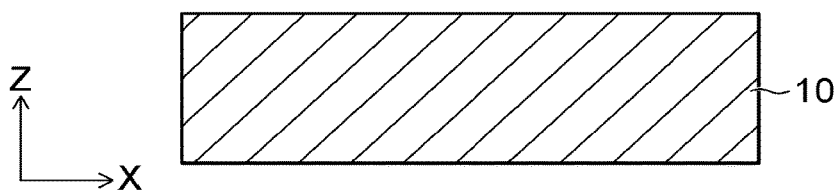
Figure 11B:
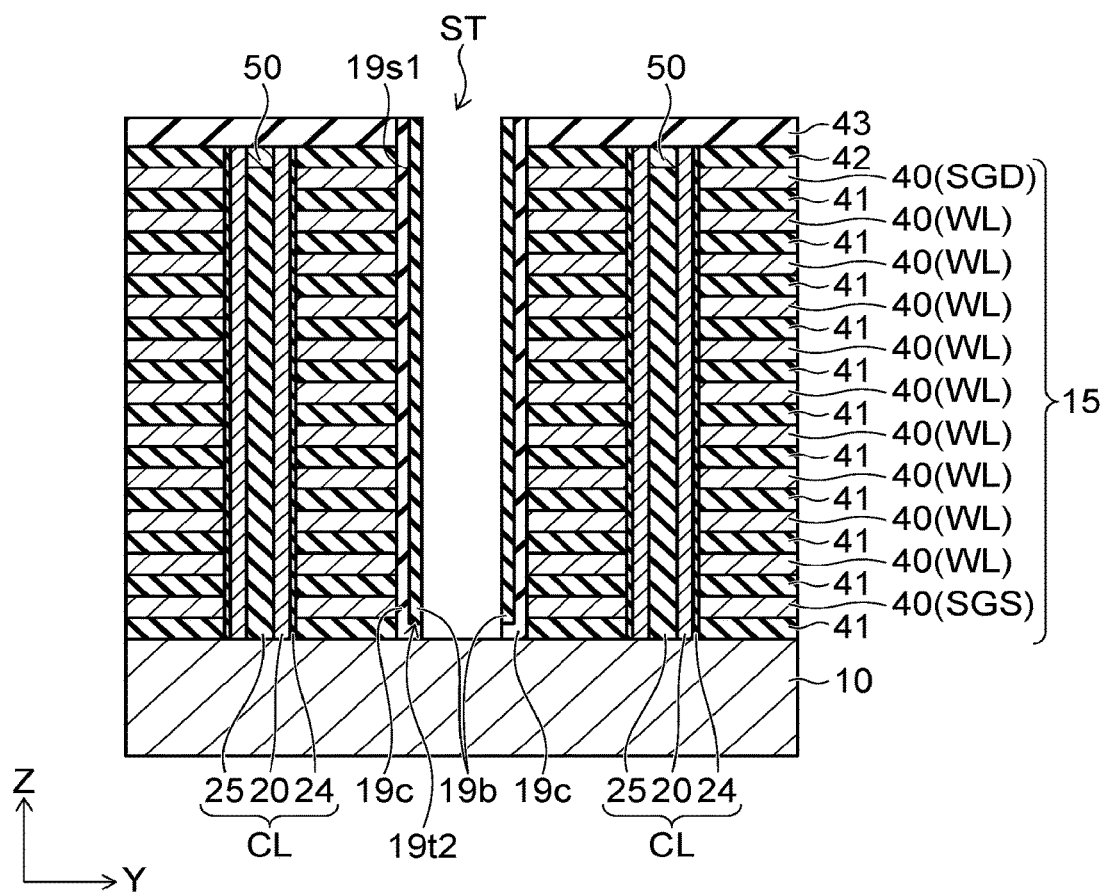

Subsequently, an insulating film 73 is formed by depositing silicon nitride on the insulating film 72 by, for example, a plasma CVD method. In a case where silicon nitride is formed by a plasma CVD method, silicon nitride is formed using silane ($SiH_4$) and ammonia ($NH_3$). Silicon nitride may be formed by a PEALD method, and in this case, silicon nitride is formed using a silicon compound such as silane or disilane ($Si_2H_6$) and a reaction gas containing hydrogen ($H_2$) and nitrogen ($N_2$). As shown in FIG. 9A and FIG. 9B, the insulating film 73 is formed in the slit ST and on the insulating film 72.

Subsequently, as shown in FIG. 10A, FIG. 10B, FIG. 11A, and FIG. 11B, the insulating film 72 and the insulating film 73 formed on the insulating layer 43 are removed by etching back. Subsequently, the insulating film 72 and the insulating film 73 are removed from the bottom surface of the slit ST by RIE, whereby the substrate 10 is exposed. By doing this, an insulating film 19b and an insulating film 19c are formed in the slit ST. The insulating film 19c covers a side surface 19s1 and a lower end 19t2 of the insulating film 19b.

Figure 13A:
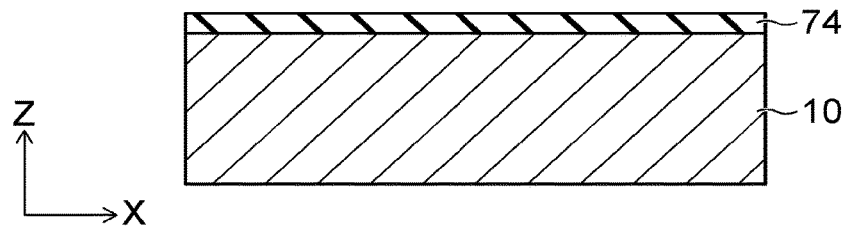
Figure 13B:
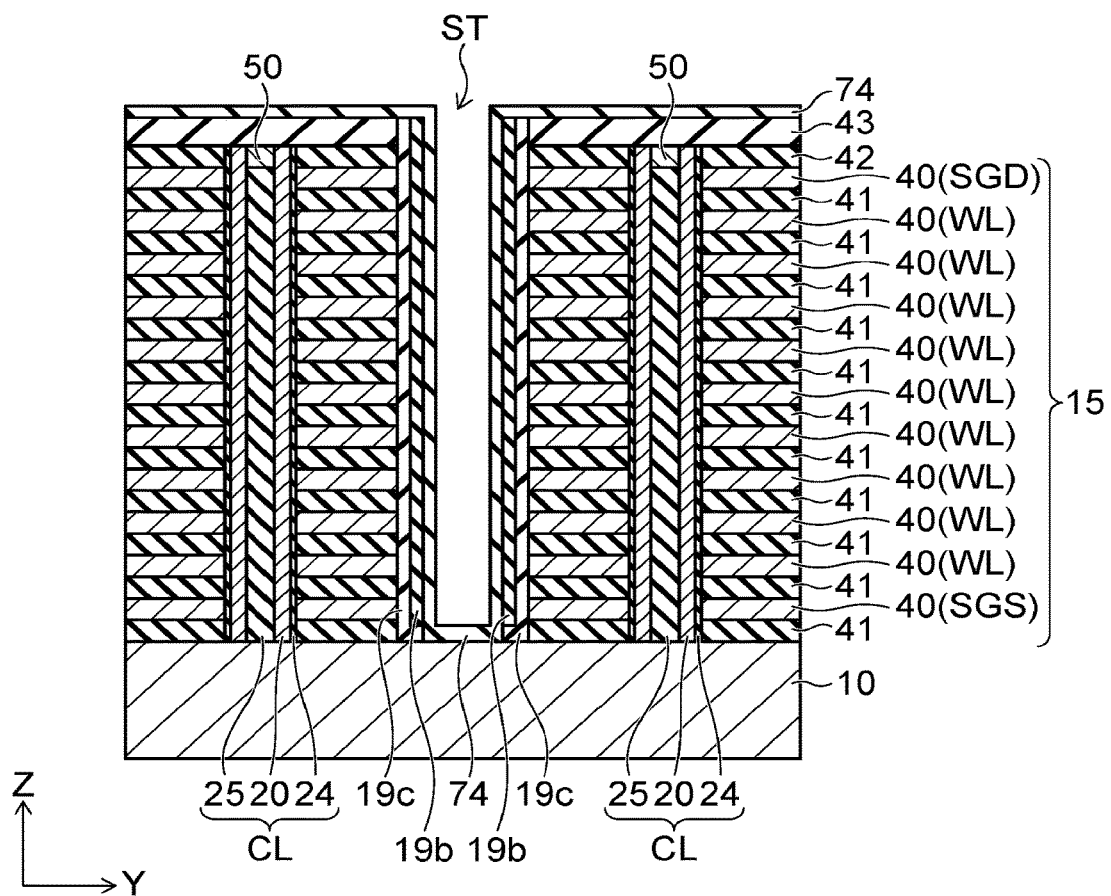
Figure 14A:
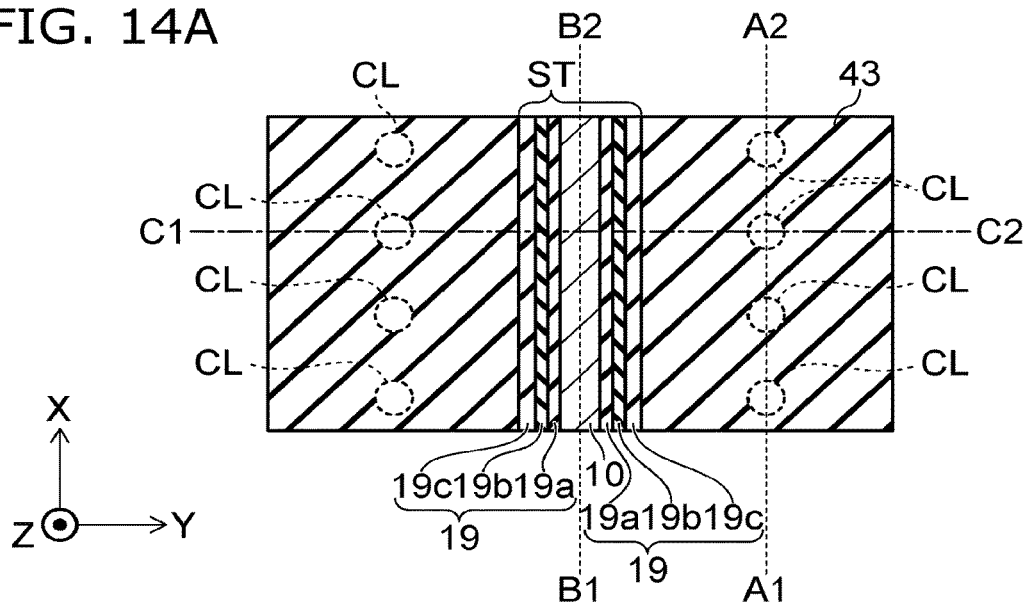
Figure 14B:
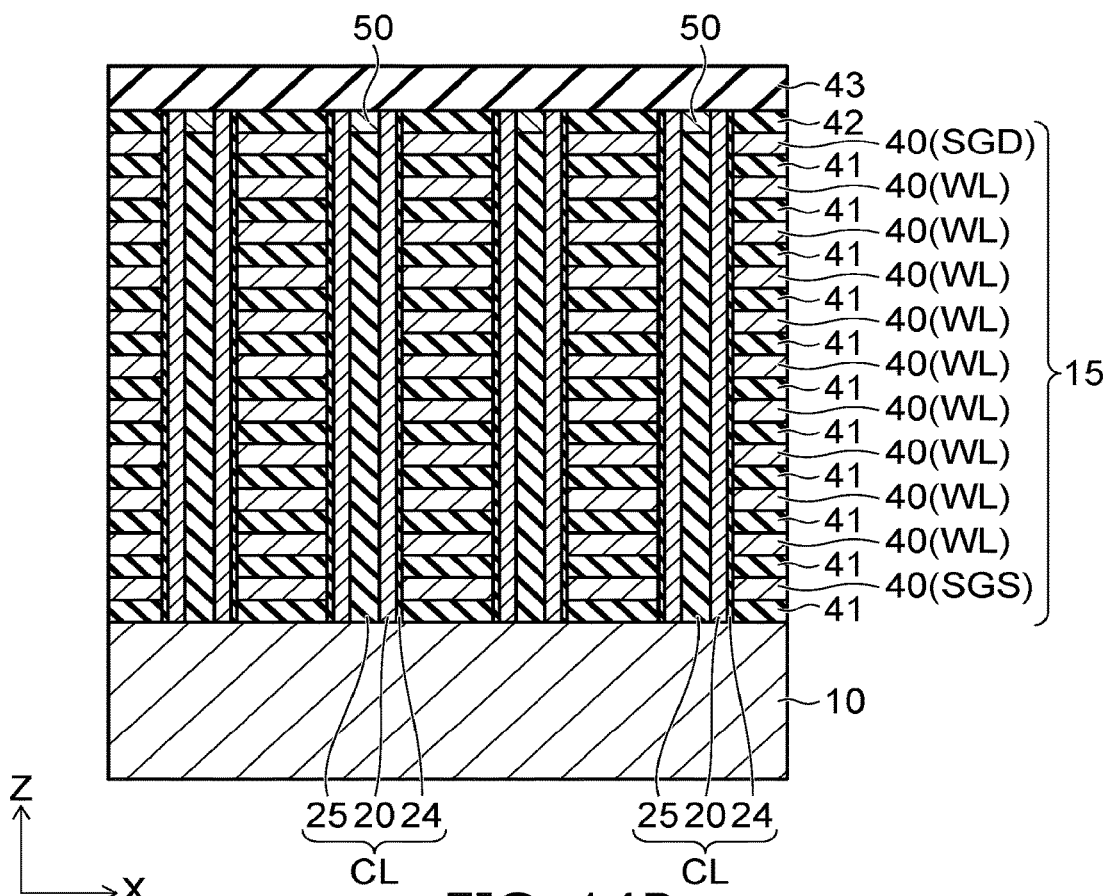
Figure 15A:
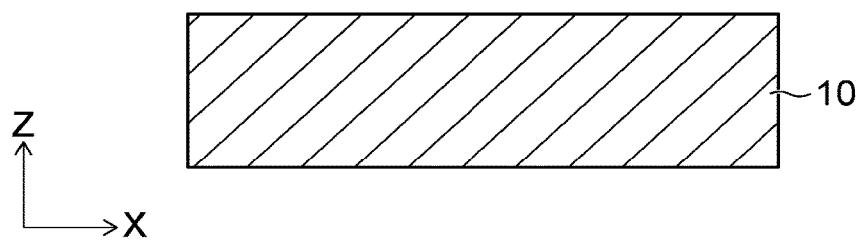
Figure 15B:
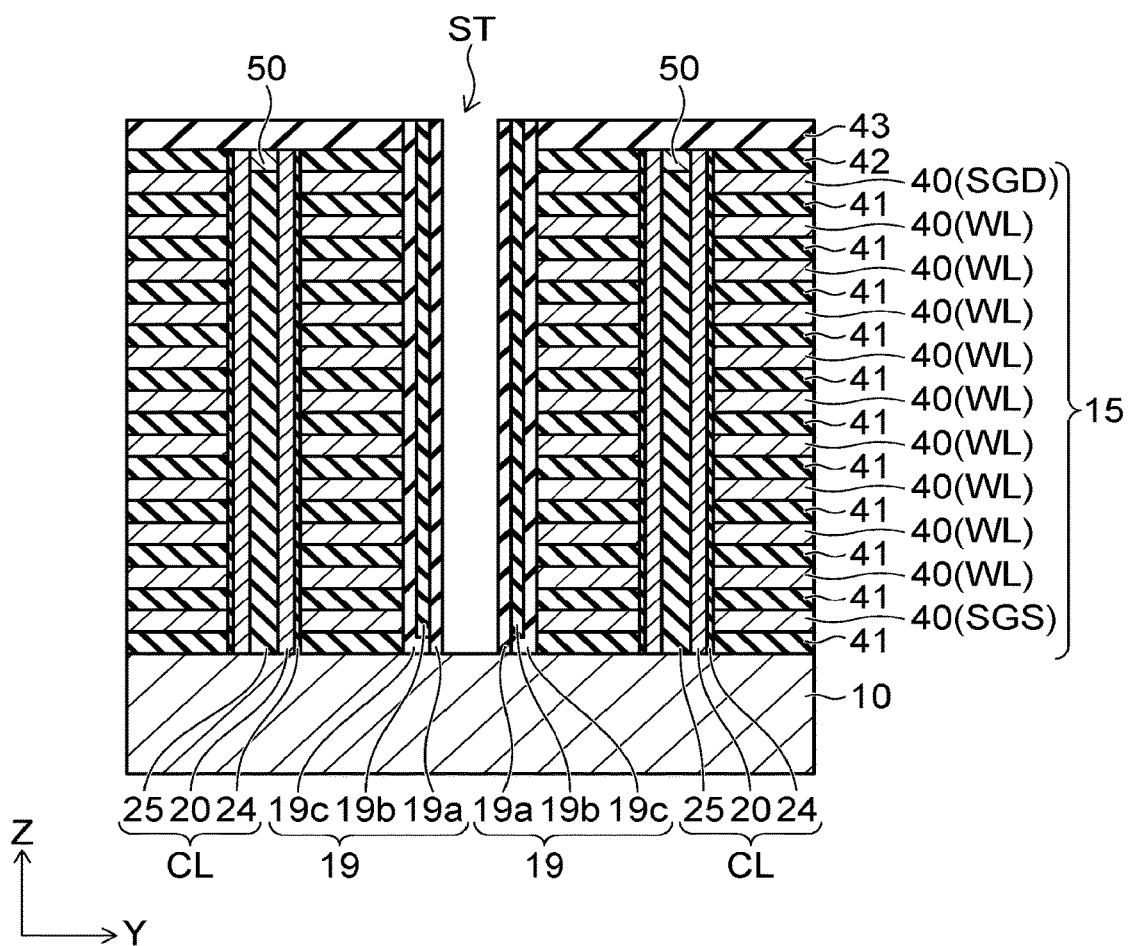
Figure 16A:
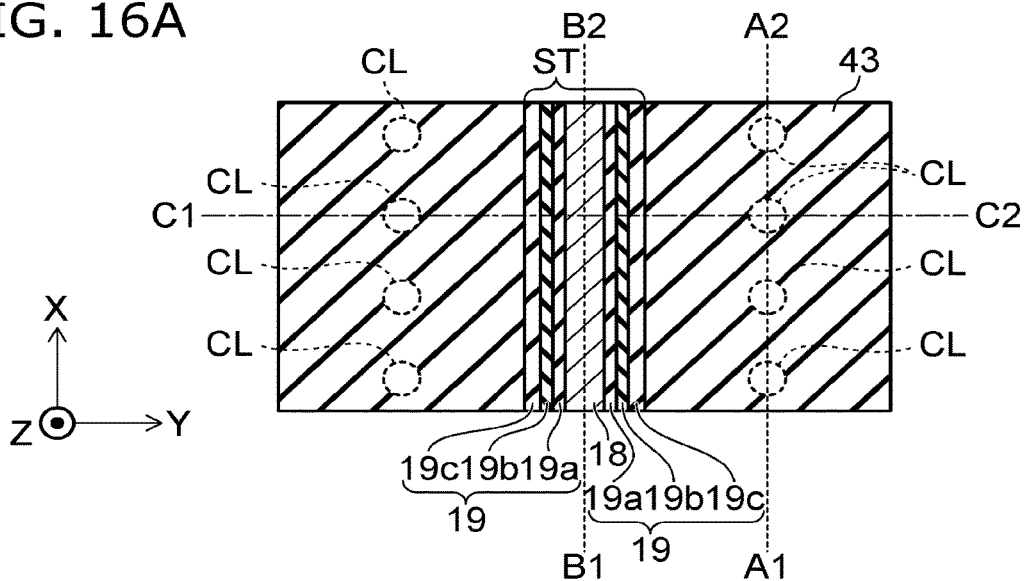
Figure 16B:
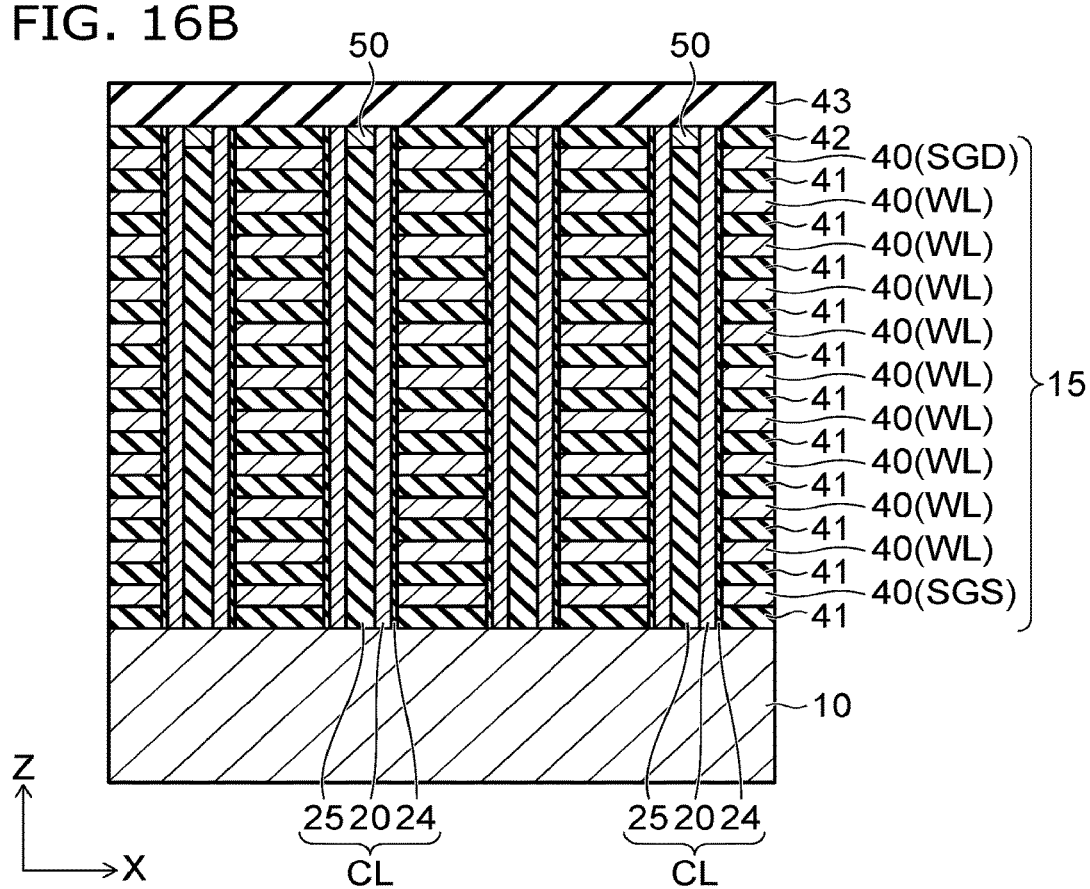

Subsequently, as shown in FIG. 12A, FIG. 12B, FIG. 13A, and FIG. 13B, an insulating film 74 is formed by depositing silicon oxide in the slit ST and on the insulating layer 43 by, for example, a PEALD method. As shown in FIG. 13A and FIG. 13B, the insulating film 74 is formed in the slit ST and on the substrate 10 and the insulating film 19b.

Subsequently, as shown in FIG. 14A, FIG. 14B, FIG. 15A, and FIG. 15B, the insulating film 74 formed on the insulating layer 43 is removed by etching back. Subsequently, the insulating film 74 is removed from the bottom surface of the slit ST by RIE, whereby the substrate 10 is exposed. By doing this, an insulating film 19a is formed in the slit ST. Further, an insulating portion 19 including the insulating film 19a, the insulating film 19b, and the insulating film 19c is formed in the slit ST. Each of the insulating film 19a, the insulating film 19b, and the insulating film 19c extends in the X-direction and Z-direction in the slit ST.

Figure 17A:
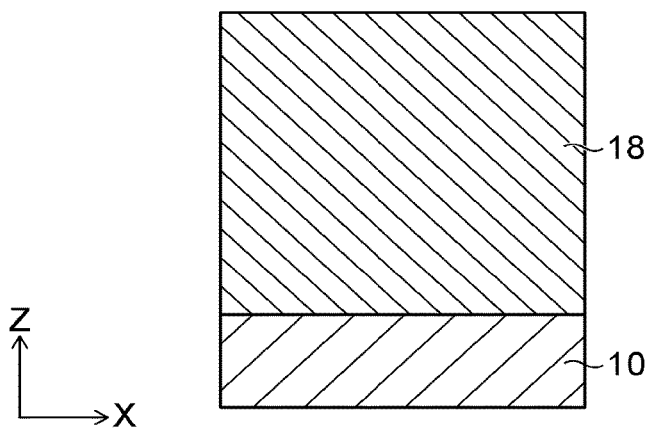
Figure 17B:
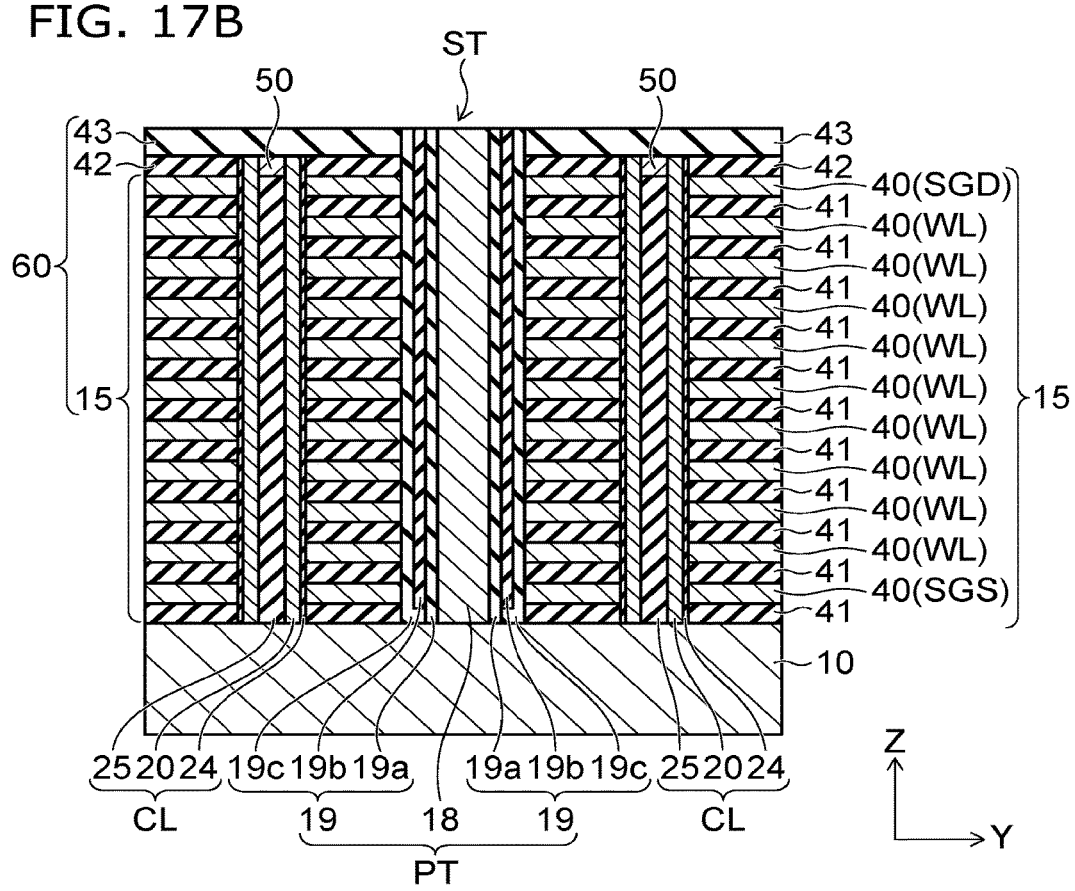

Subsequently, as shown in FIG. 16A, FIG. 16B, FIG. 17A, and FIG. 17B, an interconnect portion 18 is formed by depositing tungsten or the like thickly on the insulating film 19a in the slit ST. By doing this, a plate-shaped portion PT including the interconnect portion 18 and the insulating portion 19 is formed in the slit ST. As shown in FIG. 17A and FIG. 17B, between the interconnect portion 18 and the structure body 60, the insulating film 19a, the insulating film 19b, and the insulating film 19c are located, and a lower end of the interconnect portion 18 is in contact with the substrate 10.

Thereafter, an insulating layer 44 is formed by depositing silicon oxide on the plate-shaped portion PT and the insulating layer 43. Subsequently, a contact hole is formed in a region immediately above the contact plug 50 and in the insulating layer 43 and the insulating layer 44 by, for example, a lithography method and an RIE method. Then, after a contact portion 30 is formed by depositing a metal such as tungsten in the contact hole, a bit line BL is formed on the contact portion 30.

In this manner, the semiconductor memory device 1 according to the first embodiment is manufactured.

Hereinafter, an effect of the first embodiment will be described.

Figure 18A:
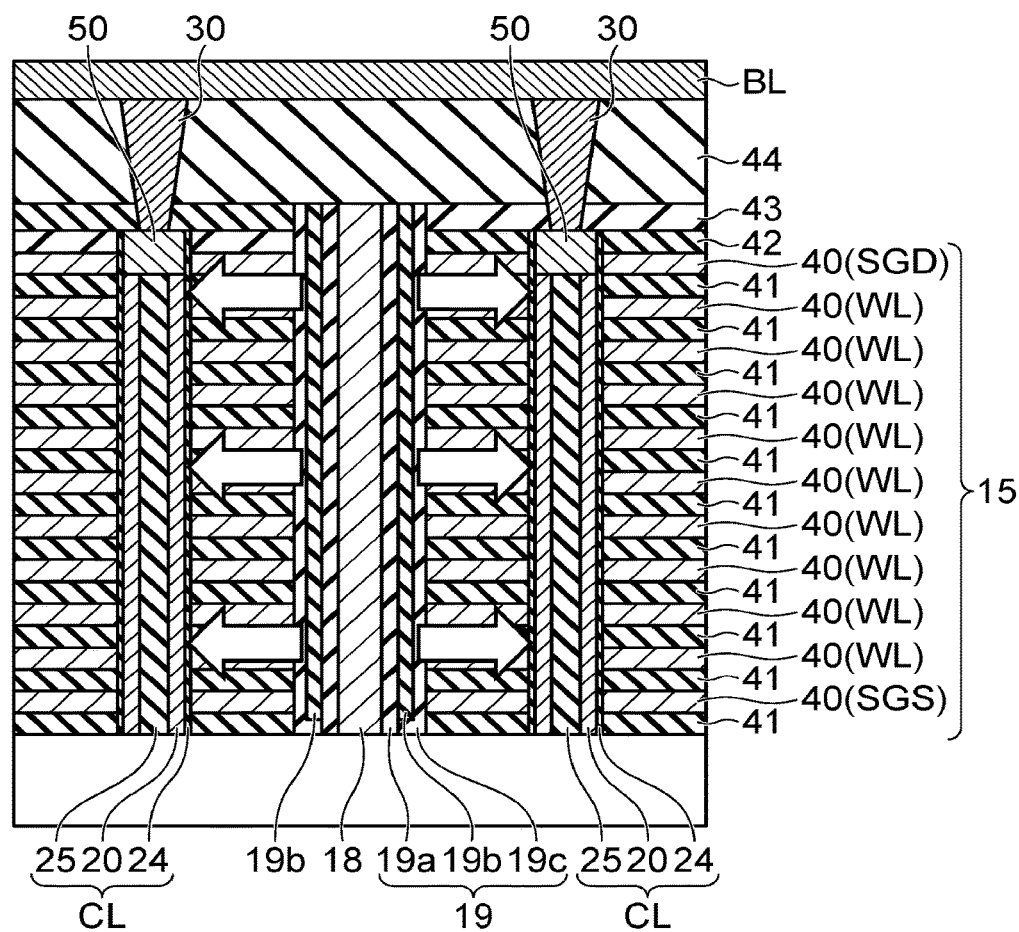
FIG. 18A and FIG. 18B are cross-sectional views showing the semiconductor memory device according to the first embodiment.
Figure 18B:
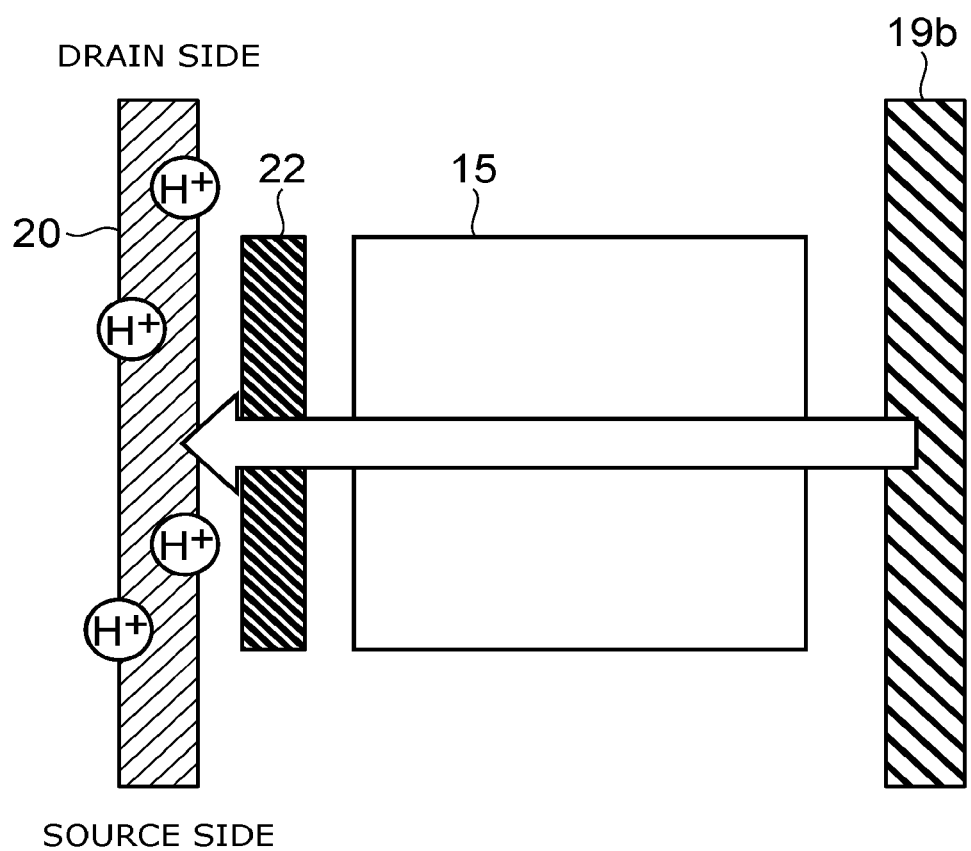

FIG. 18A and FIG. 18B are each a sectional view showing the semiconductor memory device according to the first embodiment.

FIG. 18A shows a cross section corresponding to FIG. 4, and FIG. 18B shows a portion in FIG. 18A in an enlarged manner.

In the semiconductor memory device 1 of the embodiment, the insulating film 19b containing silicon nitride is provided in the insulating portion 19 in the slit ST. Here, hydrogen is generated when forming the insulating film 19b (silicon nitride film) by a plasma CVD method. As shown by arrows in FIG. 18A and FIG. 18B, hydrogen diffuses in the stacked body 15 and reaches the channel 20 in the columnar portion CL. Then, in a case where the channel 20 contains polysilicon, hydrogen supplied to the channel 20 is bonded to an unpaired electron (dangling bond) present at a grain boundary of polysilicon as a hydrogen ion (H+) and terminates the dangling bond. Due to this, in the channel 20, a decrease in electron mobility by a trap level is suppressed. Therefore, in the memory cell MC, a cell current is increased, and a variation in threshold voltage is reduced.

According to the embodiment described above, a semiconductor memory device in which an electrical characteristic of the memory cell MC is improved can be realized.

Second Embodiment

Figure 19:
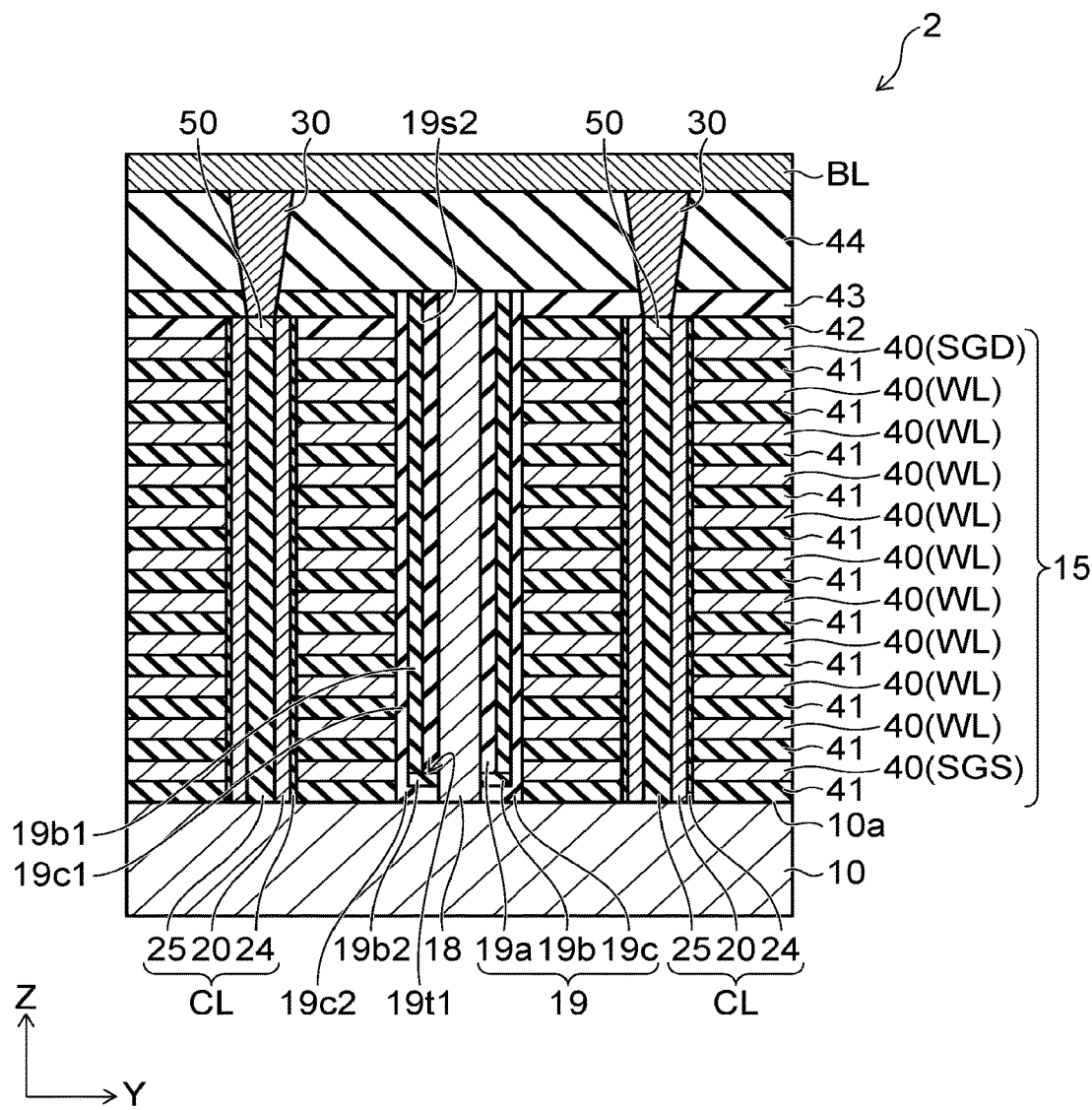
FIG. 19 is a cross-sectional view showing a semiconductor memory device according to a second embodiment.

FIG. 19 is a sectional view showing a semiconductor memory device according to a second embodiment.

FIG. 19 is a sectional view showing a semiconductor memory device 2 and shows a cross section corresponding to FIG. 4.

The embodiment and the first embodiment are different in the shape of the insulating film 19b in the insulating portion 19. A configuration other than the shape of the insulating film 19b is the same as that of the first embodiment, and therefore, a detailed description of the other configuration will be omitted.

As shown in FIG. 19, the semiconductor memory device 2 includes a stacked body 15, a plurality of columnar portions CL, and a plate-shaped portion PT. The plate-shaped portion PT is provided in a slit ST, and includes an interconnect portion 18 and an insulating portion 19. The insulating portion 19 includes an insulating film 19a, an insulating film 19b, and an insulating film 19c.

The insulating film 19b includes a side portion 19b1 and a bottom portion 19b2. The side portion 19b1 of the insulating film 19b is provided on a side surface 19s2 of the insulating film 19a. On the bottom portion 19b2 of the insulating film 19b, a lower end 19t1 of the insulating film 19a is located. A shape of the insulating film 19b is, for example, an L shape.

The insulating film 19c includes a side portion 19c1 and a bottom portion 19c2. The side portion 19c1 of the insulating film 19c is provided on the side portion 19b1 of the insulating film 19b. On the bottom portion 19c2 of the insulating film 19c, the bottom portion 19b2 of the insulating film 19b is located. A shape of the insulating film 19c is, for example, an L shape.

Hereinafter, a method for manufacturing the semiconductor memory device according to the second embodiment will be described.

FIG. 20A and FIG. 20B to FIG. 23A and FIG. 23B are views showing the method for manufacturing the semiconductor memory device according to the second embodiment.

The method for manufacturing the semiconductor memory device according to the embodiment is different from the method for manufacturing the semiconductor memory device of the first embodiment in the formation of the insulating portion 19. Therefore, since the process shown in FIG. 5 to FIG. 7 is the same between the embodiment and the first embodiment, drawings and a description corresponding thereto will be omitted.

Figure 20A:
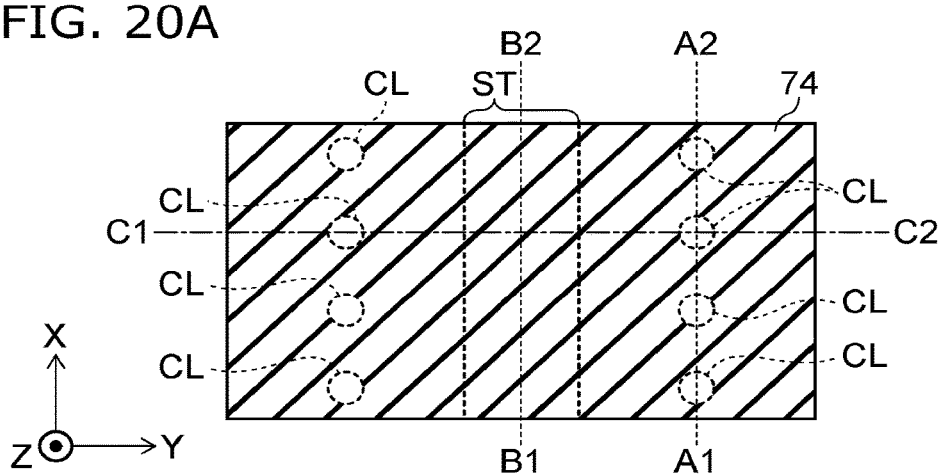
Figure 20B:
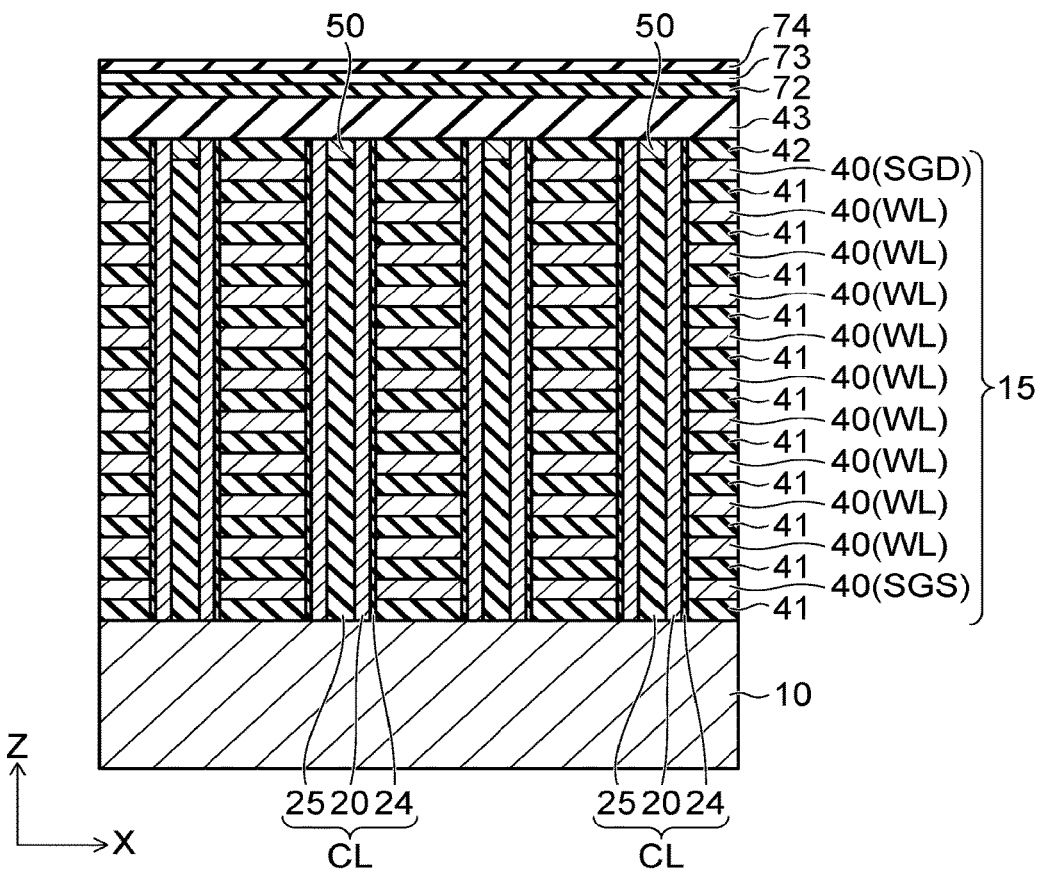
Figure 21A:
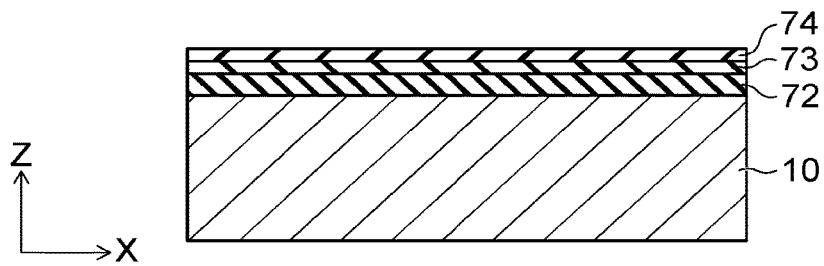
Figure 21B:
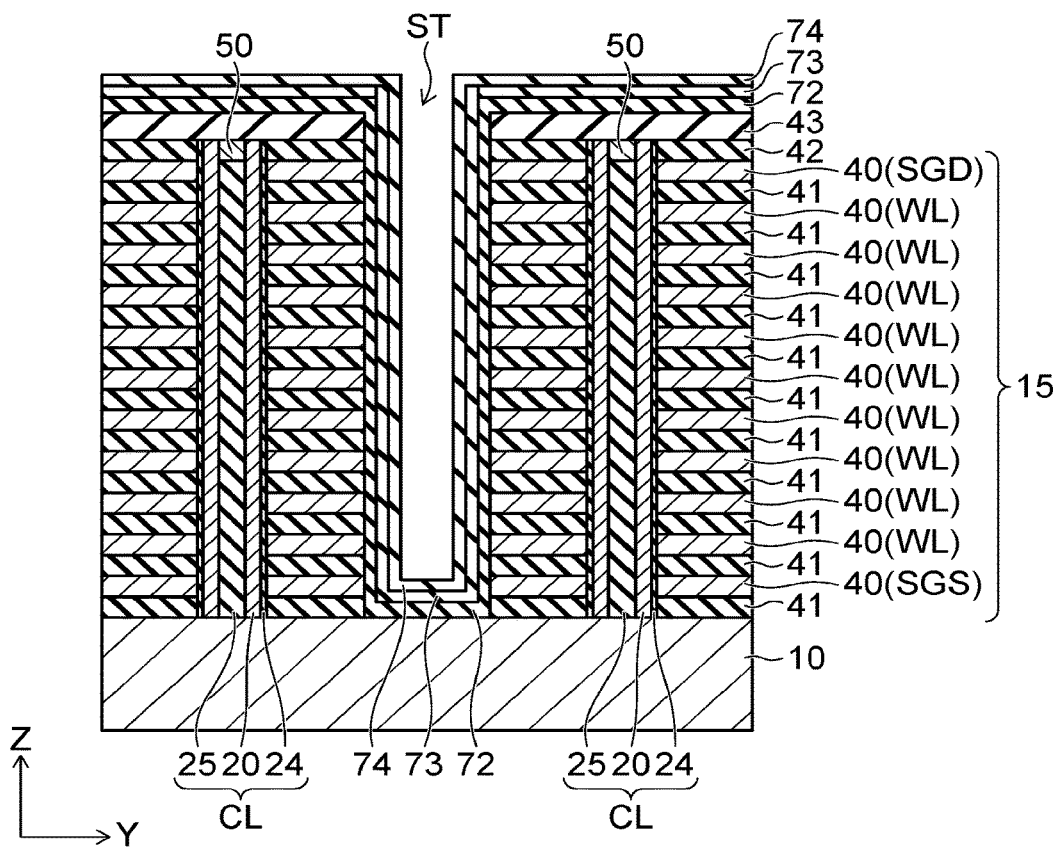
Figure 22A:
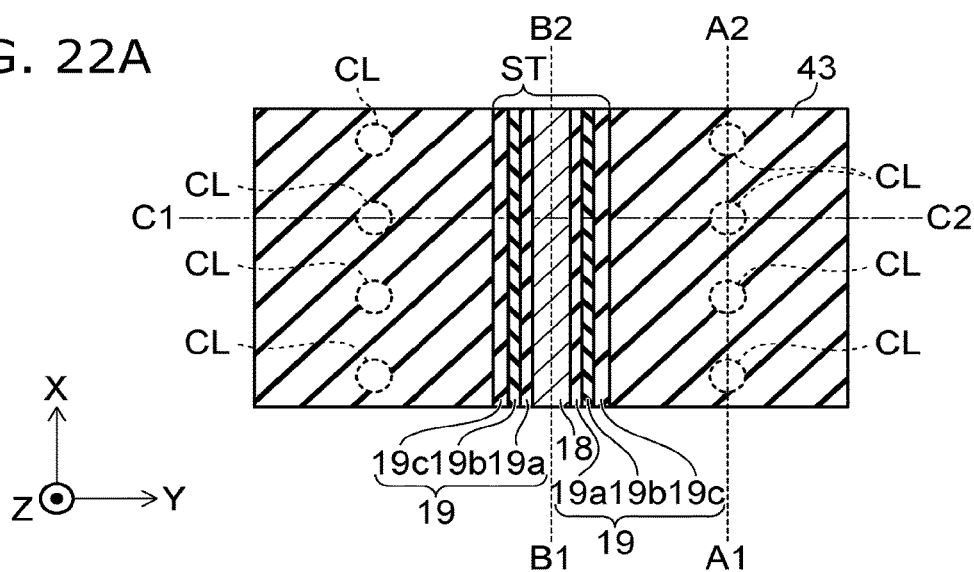
Figure 22B:
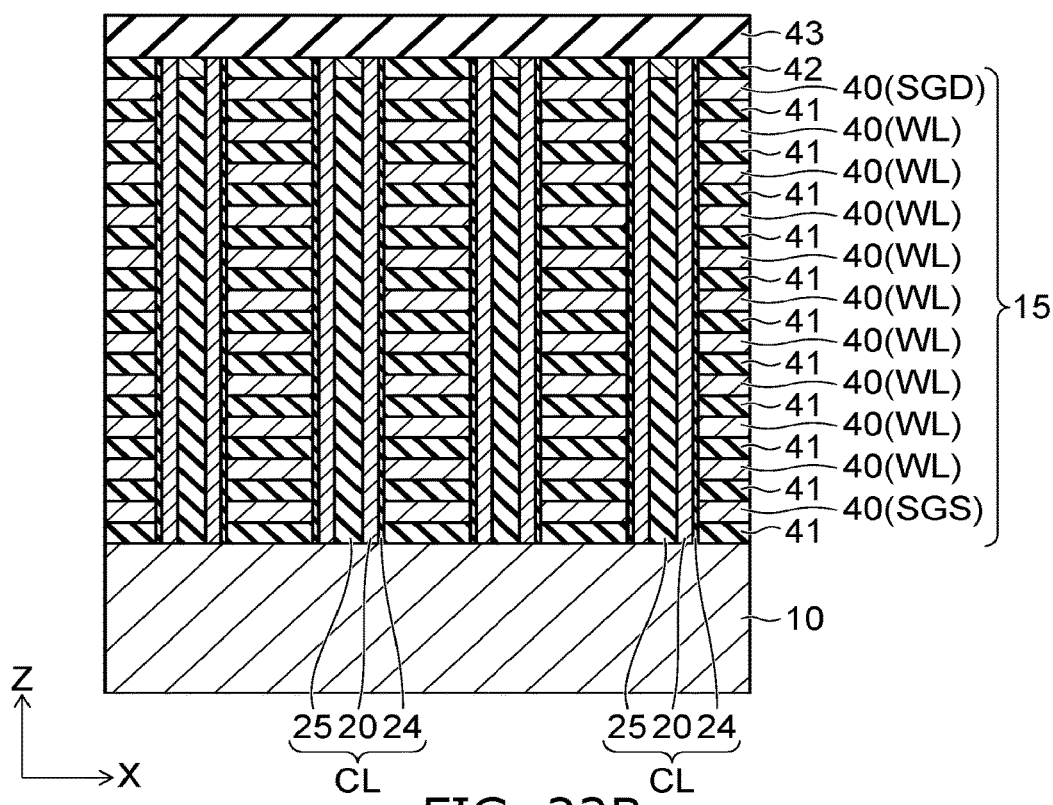
Figure 23A:
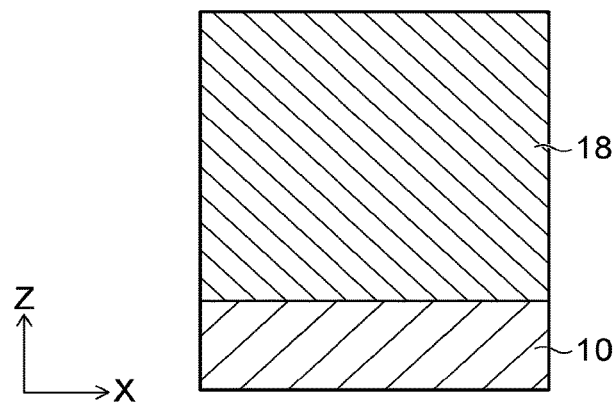
Figure 23B:
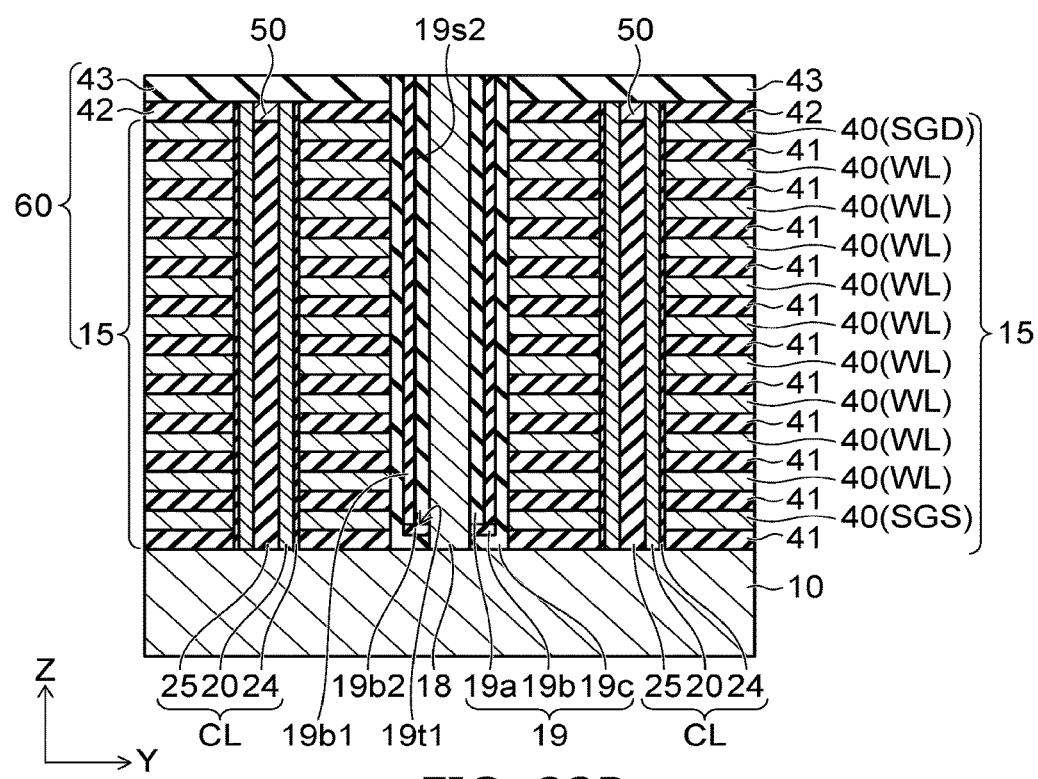

FIG. 20A and FIG. 22A are each a plane corresponding to FIG. 1, and each show a process for forming a region shown in FIG. 1 after the process in FIG. 7. FIG. 20B and FIG. 22B are each a cross section corresponding to FIG. 2A, and each show an X-Z cross section taken along a line A1-A2 of FIG. 20A and FIG. 22A, respectively. FIG. 21A and FIG. 23A are each a cross section corresponding to FIG. 3, and each show an X-Z cross section taken along a line B1-B2 of FIG. 20A and FIG. 22A, respectively. FIG. 21B and FIG. 23B are each a cross section corresponding to FIG. 19, and each show a Y-Z cross section taken along a line C1-C2 of FIG. 20A and FIG. 22A, respectively.

As shown in FIG. 20A, FIG. 20B, FIG. 21A, and FIG. 21B, an insulating film 72 is formed by depositing silicon oxide on an inner surface of a slit ST and on an insulating layer 43, an insulating film 73 is formed by depositing silicon nitride on the insulating film 72, and an insulating film 74 is formed by depositing silicon oxide on the insulating film 73.

Subsequently, as shown in FIG. 22A, FIG. 22B, FIG. 23A, and FIG. 23B, the insulating film 72, the insulating film 73, and the insulating film 74 formed on the insulating layer 43 are removed by etching back. Subsequently, by performing RIE, the insulating film 72, the insulating film 73, and the insulating film 74 are removed from a bottom surface of the slit ST, whereby the substrate 10 is exposed. By doing this, an insulating portion 19 including an insulating film 19a, an insulating film 19b, and an insulating film 19c is formed in the slit ST. The insulating film 19b covers a side surface 19s2 and a lower end 19t1 of the insulating film 19a. The insulating film 19c covers a side portion 19b1 and a bottom portion 19b2 of the insulating film 19b.

Subsequently, by forming an interconnect portion 18 in the slit ST, a plate-shaped portion PT including the interconnect portion 18 and the insulating portion 19 is formed. As shown in FIG. 23A and FIG. 23B, between the interconnect portion 18 and the structure body 60, the insulating film 19a, the insulating film 19b, and the insulating film 19c are located, and a lower end of the interconnect portion 18 is in contact with the substrate 10.

In this manner, the semiconductor memory device 2 according to the second embodiment is manufactured.

Incidentally, the effect of the embodiment is the same as that of the above-mentioned first embodiment.

Third Embodiment

Figure 24:
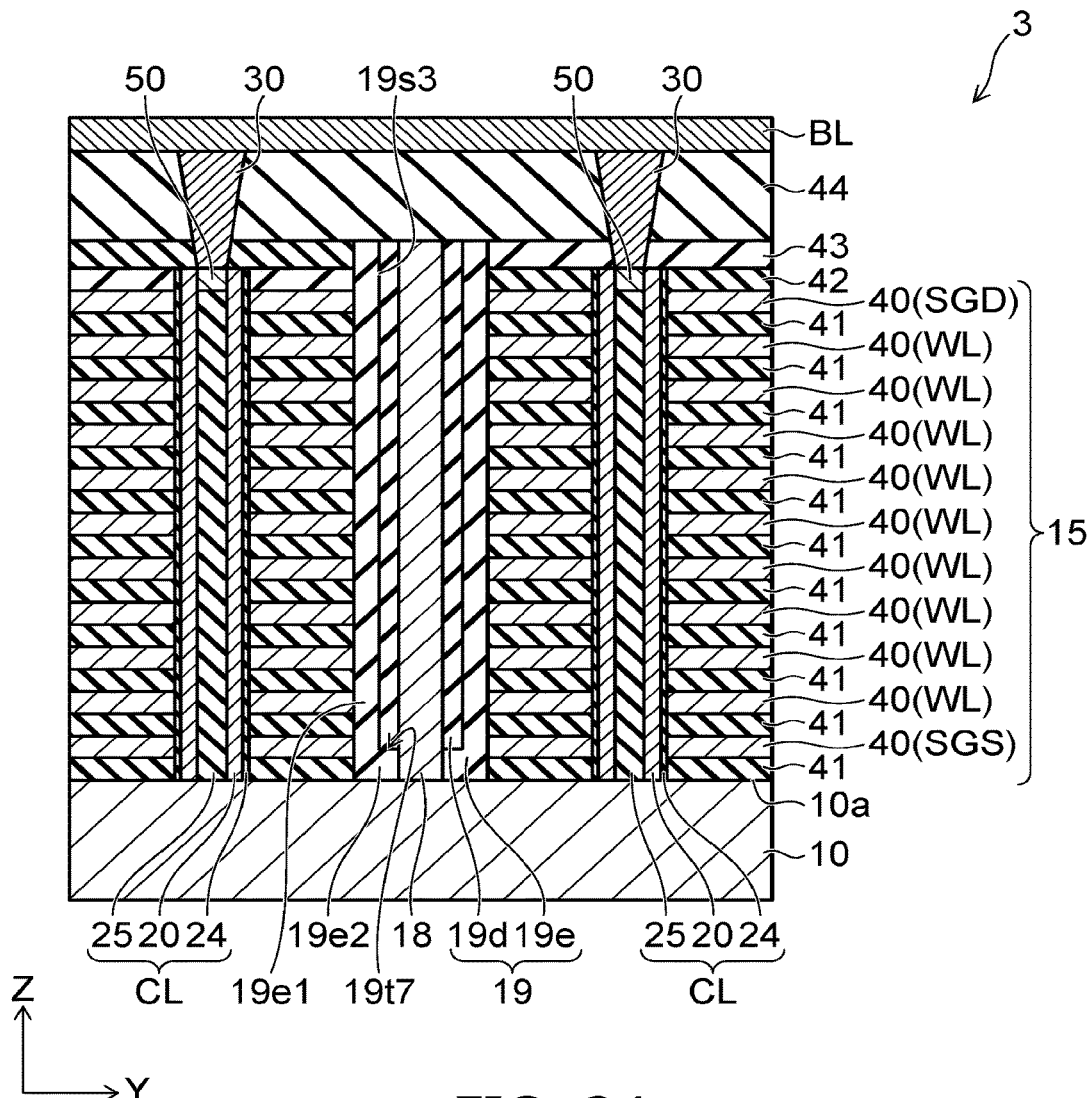
FIG. 24 is a cross-sectional view showing a semiconductor memory device according to a third embodiment.

FIG. 24 is a sectional view showing a semiconductor memory device according to a third embodiment.

FIG. 24 is a sectional view showing a semiconductor memory device 3 and shows a cross section corresponding to FIG. 4.

As shown in FIG. 24, an insulating portion 19 includes an insulating film 19d and an insulating film 19e. The insulating film 19d is provided on a side surface of an interconnect portion 18. The insulating film 19e includes a side portion 19e1 and a bottom portion 19e2. The side portion 19e1 of the insulating film 19e is provided on a side surface 19s3 of the insulating film 19d. On the bottom portion 19e2 of the insulating film 19e, a lower end 19t7 of the insulating film 19d is located. A shape of the insulating film 19e is, for example, an L shape. That is, in the embodiment, the insulating portion 19 is formed of two insulating films.

For example, the insulating film 19d contains silicon nitride, and the insulating film 19e contains silicon oxide. Incidentally, the insulating film 19d may contain silicon oxide and the insulating film 19e may contain silicon nitride.

In the semiconductor memory device 3 of the embodiment, the insulating film 19d containing silicon nitride is provided in the insulating portion 19 in a slit ST. By providing such an insulating film 19d, hydrogen diffuses in a stacked body 15 and reaches a channel 20 in a columnar portion CL when forming the insulating film 19d (silicon nitride film). Therefore, in the channel 20, a decrease in electron mobility by a trap level is suppressed. Therefore, in a memory cell MC, a cell current is increased, and a variation in threshold voltage is reduced.

Further, a distance in the Y-direction between the insulating film 19e and the channel 20 is smaller than a distance in the Y-direction between the insulating film 19d and the channel 20. Therefore, in a case where a silicon nitride is formed in the insulating film 19e, hydrogen contained in the silicon nitride more easily reaches the channel 20 in the columnar portion CL as compared with a case where a silicon nitride is formed in the insulating film 19d. As a result, in the channel 20, a decrease in electron mobility by a trap level is suppressed.

Fourth Embodiment

Figure 25:
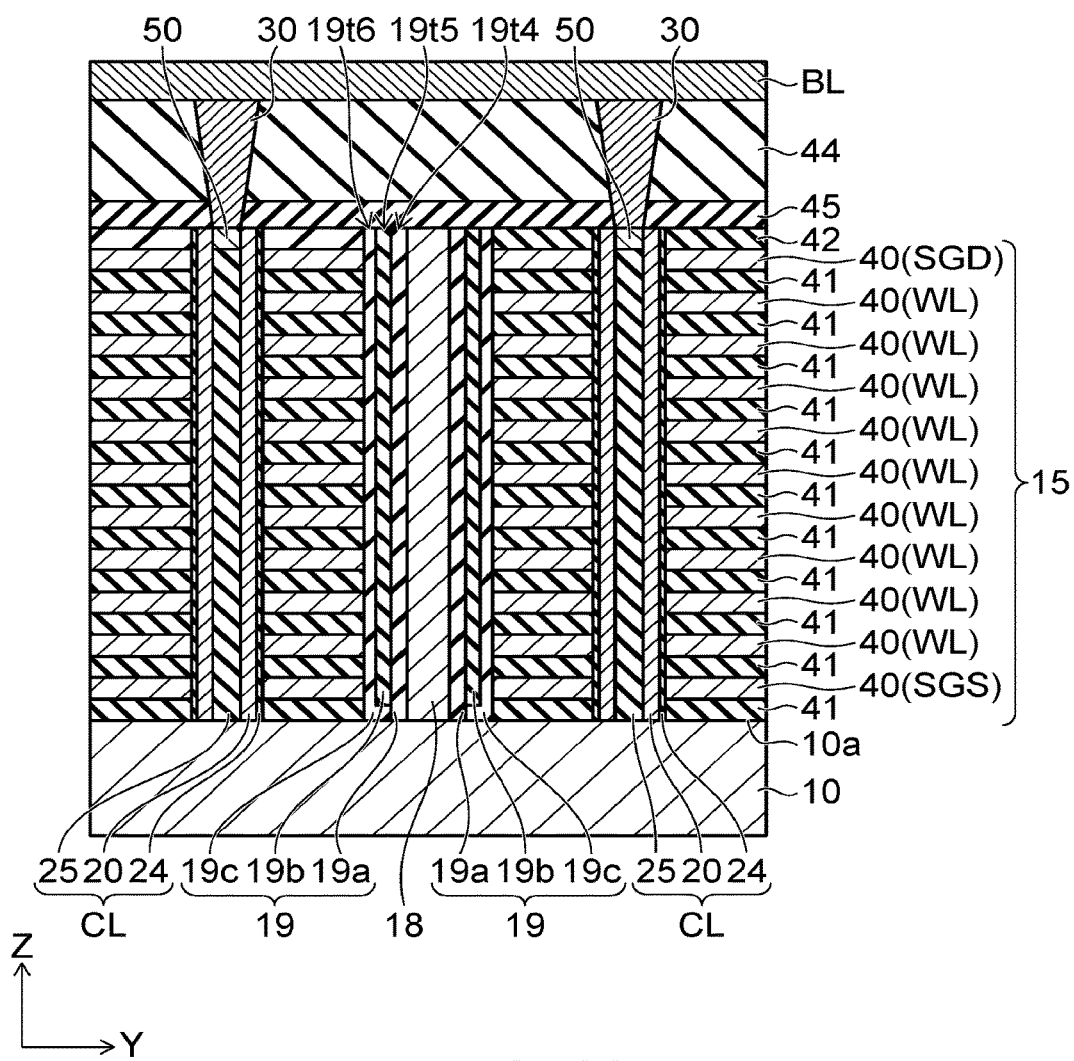
FIG. 25 is a cross-sectional view showing a semiconductor memory device according to a fourth embodiment.

FIG. 25 is a sectional view showing a semiconductor memory device according to a fourth embodiment.

FIG. 25 is a sectional view showing a semiconductor memory device 4 and shows a cross section corresponding to FIG. 4.

The embodiment and the first embodiment are different in that an insulating layer 45 is formed in place of the insulating layer 43. A configuration other than the insulating layer 45 is the same as that of the first embodiment, and therefore, a detailed description of the other configuration will be omitted.

As shown in FIG. 25, the insulating layer 45 is provided between an insulating layer 44 and each of an interconnect portion 18, an insulating portion 19, and an insulating layer 42. The insulating layer 45 contains, for example, silicon nitride. The insulating layer 45 is located on an upper end 19t4 of an insulating film 19a, an upper end 19t5 of an insulating film 19b, and an upper end 19t6 of an insulating film 19c, and for example, is in contact with the upper ends 19t4, 19t5, and 19t6. In the insulating layer 44 and the insulating layer 45, a contact portion 30 is located.

Hereinafter, an effect of the fourth embodiment will be described.

In the semiconductor memory device 4 of the embodiment, the insulating layer 45 containing silicon nitride is provided on a stacked body 15. By providing such an insulating layer 45, hydrogen generated when forming the insulating film 19b (silicon nitride film) hardly diffuses on an upper side of the insulating layer 45. That is, the insulating layer 45 functions as a block layer which suppresses diffusion of hydrogen. Therefore, hydrogen diffuses in the stacked body 15 and easily reaches a channel 20 in a columnar portion CL. As a result, in the channel 20, a decrease in electron mobility by a trap level is suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, comprising:
a substrate;
a stacked body provided on the substrate and including a plurality of electrode layers separately stacked each other;
a semiconductor portion provided in the stacked body and extending in a stacking direction of the plurality of electrode layers;
a charge storage film provided between the semiconductor portion and the stacked body;
an insulating portion provided in the stacked body and extending in the stacking direction and a first direction along a surface of the substrate, the first direction crossing the stacking direction, the insulating portion including a first insulating film containing silicon oxide, a second insulating film containing silicon oxide, and a third insulating film located between the first insulating film and the second insulating film and containing silicon nitride; and
an insulating layer provided on the stacked body and the insulating portion and containing silicon nitride,
the first insulating film including a first side portion extending in the stacking direction and a first bottom portion connected to the first side portion,
the first side portion of the first insulating film being located on a side surface of the third insulating film, a lower end of the third insulating film being located on the first bottom portion of the first insulating film, and the first bottom portion of the first insulating film and the third insulating film being located on a side surface of the second insulating film.

2. The device according to claim 1, wherein a shape of the insulating portion is a plate shape, and a shape of the first insulating film is an L shape when viewed from the first direction.

3. A semiconductor memory device, comprising:

a substrate;

a stacked body provided on the substrate and including a plurality of electrode layers separately stacked each other, the electrode layers extending in a first direction along a surface of the substrate;

a semiconductor portion provided in the stacked body and extending in a stacking direction of the plurality of electrode layers;

an interconnect portion provided in the stacked body and extending in the first direction and the stacking direction;

an insulating portion provided on a side surface of the interconnect portion, extending in the stacking direction and the first direction, and including a first insulating film, a second insulating film and a third insulating film, the first insulating film containing silicon oxide, the second insulating film containing silicon oxide and located on a side surface of the interconnect portion, the third insulating film containing silicon nitride and located between the first insulating film and the second insulating film; and an insulating layer provided on the stacked body and the insulating portion and containing silicon nitride, the first insulating film including a first side portion extending in the stacking direction and a first bottom portion connected to the first side portion, the first side portion of the first insulating film being located on a side surface of the third insulating film, a lower end of the third insulating film being located on the first bottom portion of the first insulating film, and the first bottom portion of the first insulating film and the third insulating film being located on a side surface of the second insulating film.

4. The device according to claim 3, wherein a shape of the insulating portion is a plate shape, and a shape of the first insulating film is an L shape when viewed from the first direction.

5. The device according to claim 3, further comprising a charge storage film provided around the semiconductor portion.

* * * * *